(12) United States Patent
Park et al.

(10) Patent No.: US 10,388,699 B2
(45) Date of Patent: Aug. 20, 2019

(54) THREE-DIMENSIONAL SEMICONDUCTOR MEMORY DEVICES

(71) Applicant: SAMSUNG ELECTRONICS CO., LTD., Suwon-si, Gyeonggi-Do (KR)

(72) Inventors: Mu-Hui Park, Hwaseong-si (KR); Wooyeong Cho, Suwon-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 15/586,307

(22) Filed: May 4, 2017

(65) Prior Publication Data
US 2018/0012937 A1 Jan. 11, 2018

(30) Foreign Application Priority Data
Jul. 6, 2016 (KR) .................. 10-2016-0085592

(51) Int. Cl.
H01L 27/24 (2006.01)
H01L 45/00 (2006.01)
H01L 23/535 (2006.01)

(52) U.S. Cl.
CPC ........ *H01L 27/2454* (2013.01); *H01L 23/535* (2013.01); *H01L 45/1233* (2013.01); *H01L 45/143* (2013.01); *H01L 45/144* (2013.01)

(58) Field of Classification Search
CPC ............... H01L 27/2454; H01L 23/535; H01L 45/1233; H01L 45/143; H01L 45/144
USPC .......................................................... 257/4
See application file for complete search history.

(56) References Cited

U.S. PATENT DOCUMENTS

| | | |
|---|---|---|
| 7,466,584 B1 | 12/2008 | Parkinson et al. |
| 7,880,160 B2 | 2/2011 | Nirschl |
| 8,389,973 B2 | 3/2013 | Nirschl |
| 8,946,670 B1 | 2/2015 | Park |
| 9,024,290 B2 | 5/2015 | Liu |
| 9,159,740 B2 | 10/2015 | Park |
| 9,293,510 B1 | 3/2016 | Park |
| 2008/0106922 A1 | 5/2008 | Park et al. |
| 2008/0175031 A1* | 7/2008 | Park .................. G11C 5/02 365/51 |
| 2010/0270529 A1* | 10/2010 | Lung .................. G11C 13/0004 257/4 |
| 2010/0330623 A1* | 12/2010 | Blattner .................. C12N 9/93 435/107 |
| 2011/0242885 A1 | 10/2011 | Kim |

(Continued)

Primary Examiner — Didarul A Mazumder
(74) Attorney, Agent, or Firm — Volentine, Whitt & Francos, PLLC

(57) ABSTRACT

A three-dimensional semiconductor memory device includes first to third cell array layers sequentially stacked on a substrate. Each of the first to third cell array layers includes memory cells arranged along first and second directions crossing each other and parallel to a top surface of the substrate. Each of the memory cells includes a variable resistance element and a tunnel field effect transistor connected in series. The device further includes bit lines extending along the first direction between the first and second cell array layers and at least one source line extending along either the first direction or the second direction between the second and third cell array layers. The memory cells of the first and second cell array layers share the bit lines, and the memory cells of the second and third cell array layers share the source line.

15 Claims, 19 Drawing Sheets

(56) References Cited

U.S. PATENT DOCUMENTS

| | | | |
|---|---|---|---|
| 2012/0032249 A1* | 2/2012 | Matsuda | H01L 27/11578 257/324 |
| 2013/0056812 A1* | 3/2013 | Kim | H01L 27/101 257/295 |
| 2013/0237028 A1* | 9/2013 | Furuhashi | H01L 45/04 438/382 |
| 2014/0198553 A1* | 7/2014 | Lung | G11C 13/0004 365/63 |
| 2014/0239247 A1 | 8/2014 | Park | |
| 2015/0221867 A1 | 8/2015 | Toh et al. | |
| 2015/0243707 A1 | 8/2015 | Park | |
| 2015/0318038 A1 | 11/2015 | Hu et al. | |
| 2015/0325695 A1 | 11/2015 | Suh et al. | |
| 2015/0372135 A1 | 12/2015 | Park | |

\* cited by examiner

|  | WL | | BL | |
|---|---|---|---|---|
|  | Selected | Unselected | Selected | Unselected |
| Write | $V_{WL1}$ | 0V | $V_{BL1}$ | 0V |
| Read | $V_{WL2}$ | 0V | $V_{BL2}$ | 0V |
| Test Mode | 0V | – | $V_{negative}$ | – |

THREE-DIMENSIONAL SEMICONDUCTOR MEMORY DEVICES

CROSS-REFERENCE TO RELATED APPLICATIONS

This U.S. non-provisional patent application claims priority under 35 U.S.C § 119 of Korean Patent Application 10-2016-0085592 filed on Jul. 6, 2016, the entire contents of which are hereby incorporated by reference.

BACKGROUND

The disclosure relates to a semiconductor memory device and, more particularly, to a three-dimensional variable resistance memory device.

According to demand for high capacity and low power consumption of a memory device, research is being conducted on next-generation memory devices that are nonvolatile and do not require a refresh operation. The next-generation memory devices are required to have high integration characteristics of DRAM (dynamic random access memory), nonvolatile characteristics of flash memory, and/or high speed of SRAM (static RAM). PRAM (phase change RAM), NFGM (nano floating gate memory), PoRAM (polymer RAM), MRAM (magnetic RAM), FeRAM (ferroelectric RAM), and/or RRAM (resistive RAM) are being studied as the next-generation memory device to meet the above-mentioned requirements.

SUMMARY

Embodiments of the disclosure provide a three-dimensional semiconductor memory device having enhanced integration and electrical characteristics.

According to exemplary embodiments of the disclosure, a three-dimensional semiconductor memory device may include first, second, and third cell array layers that are sequentially stacked on a substrate. Each of the first to third cell array layers may include a plurality of memory cells arranged along first and second directions that cross each other and are parallel to a top surface of the substrate. Each of the memory cells includes a variable resistance element and a tunnel field effect transistor that are connected in series. A plurality of bit lines extends along the first direction between the first and second cell array layers. The memory cells of the first and second cell array layers may share the bit lines. A source line extends along either the first direction or the second direction between the second and third cell array layers, and the memory cells of the second and third cell array layers share the source line.

According to exemplary embodiments of the disclosure, a three-dimensional semiconductor memory device may include a plurality of first memory cells arranged along first and second directions crossing each other at a first height from a substrate. A plurality of lower word lines extend along the first direction and control the first memory cells. A plurality of second memory cells are arranged along the first and second directions at a second height greater than the first height from the substrate. A plurality of upper word lines extend along the first direction and control the second memory cells. A plurality of bit lines extend along the second direction. Each of the bit lines is commonly connected to the first and second memory cells that are vertically adjacent to each other and arranged along the second direction. The first memory cells may include first semiconductor pillars penetrating the lower word lines. The second memory cells may include second semiconductor pillars penetrating the upper word lines. Each of the first and second pillars may include source and drain regions having conductivities opposite to each other.

According to exemplary embodiments of the disclosure, a three-dimensional semiconductor memory device may include first and second common source electrodes that are stacked and vertically spaced apart from each other on a substrate. Lower and upper word line layers are vertically stacked between the first and second common source electrodes. The lower word line layer includes a plurality of lower word lines extending along a first direction, and the upper word line layer includes a plurality of upper word lines extending along the first direction. A bit line layer is disposed between the lower and upper word line layers. The bit line layer includes a plurality of bit lines extend along a second direction crossing the first direction. A plurality of lower memory cells is connected between the lower word lines and the bit lines. The plurality of lower memory cells is disposed between the lower word line layer and the bit line layer. A plurality of upper memory cells is connected between the upper word lines and the bit lines, and the plurality of upper memory cells is disposed between the upper word line layer and the bit line layer.

According to exemplary embodiments of the disclosure, a three-dimensional semiconductor memory device includes first and second source lines, a bit line, a plurality of first memory cells directly interconnected between the first source line and the bit line, and a plurality of second memory cells directly interconnected between the second source line and the bit line.

DETAILED DESCRIPTION OF EMBODIMENTS

It will be hereinafter discussed about a three-dimensional semiconductor memory device with reference to figures according to exemplary embodiments of the disclosure.

Figure 1:
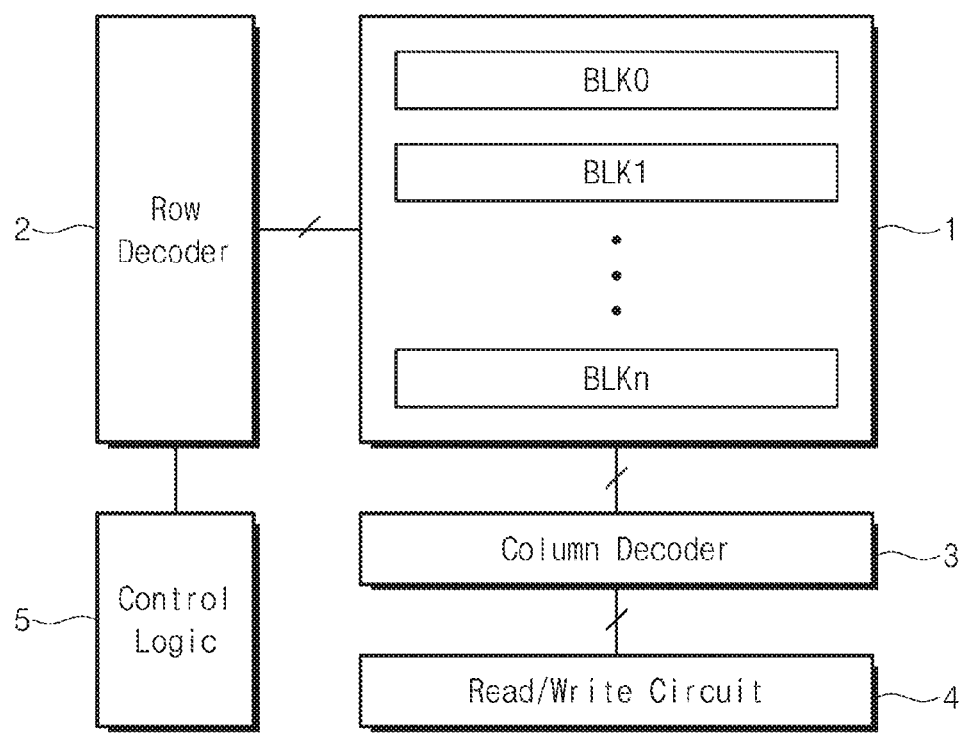
FIG. 1 is a schematic block diagram illustrating a three-dimensional semiconductor memory device according to exemplary embodiments of the disclosure.

FIG. 1 is a schematic block diagram illustrating a three-dimensional semiconductor memory device according to exemplary embodiments of the disclosure.

Referring to FIG. 1, a semiconductor memory device may include a memory cell array 1, a row decoder 2, a column decoder 3, a read/write circuit 4, and a control logic 5.

The memory cell array 1 may include a plurality of memory blocks BLK0 to BLKn, and each of the memory blocks BLK0 to BLKn may include a plurality of memory cells and a plurality of word lines and bit lines that are electrically connected to the memory cells.

The row decoder 2 may decode an address input externally and select one of the word lines. The column decoder 3 may decode an address input externally and select one of the bit lines.

The read/write circuit 4 may be connected to the memory cell array 1 through the bit lines. The read/write circuit 4 may select a bit line in response to a bit line selection signal (not shown) from the column decoder 3. The read/write circuit 4 may operate in response to the control of the control logic 5. The read/write circuit 4 may receive power (e.g., voltage or current) from the control logic 5 and provide the received power to the bit line. The read/write circuit 4 may be configured to communicate data externally. For example, the read/write circuit 4 may include a page buffer (or a page register) and a data buffer. Alternatively, the read/write circuit 4 may include a sense amplifier, a write drive, and a data buffer.

The control logic 5 may control the overall operation of a three-dimensional semiconductor memory device. The control logic 5 may output various control signals for writing data to the memory cell array 1 and/or reading data from the memory cell array 1. The control logic 5 may control read, write, and/or erase operations in response to the control signals. The control logic 5 may use an external voltage so as to produce power required for an internal operation.

Figure 2:
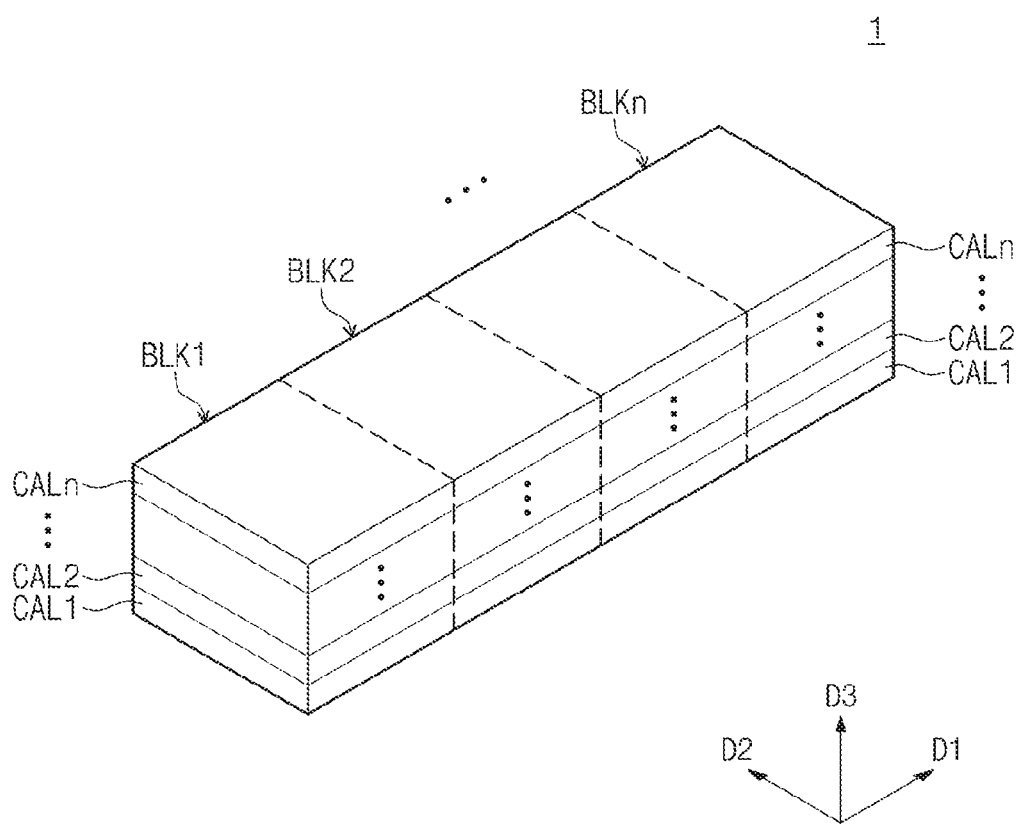
FIG. 2 is a schematic block diagram illustrating a memory cell array of a three-dimensional semiconductor memory device according to exemplary embodiments of the disclosure.
Figure 3:
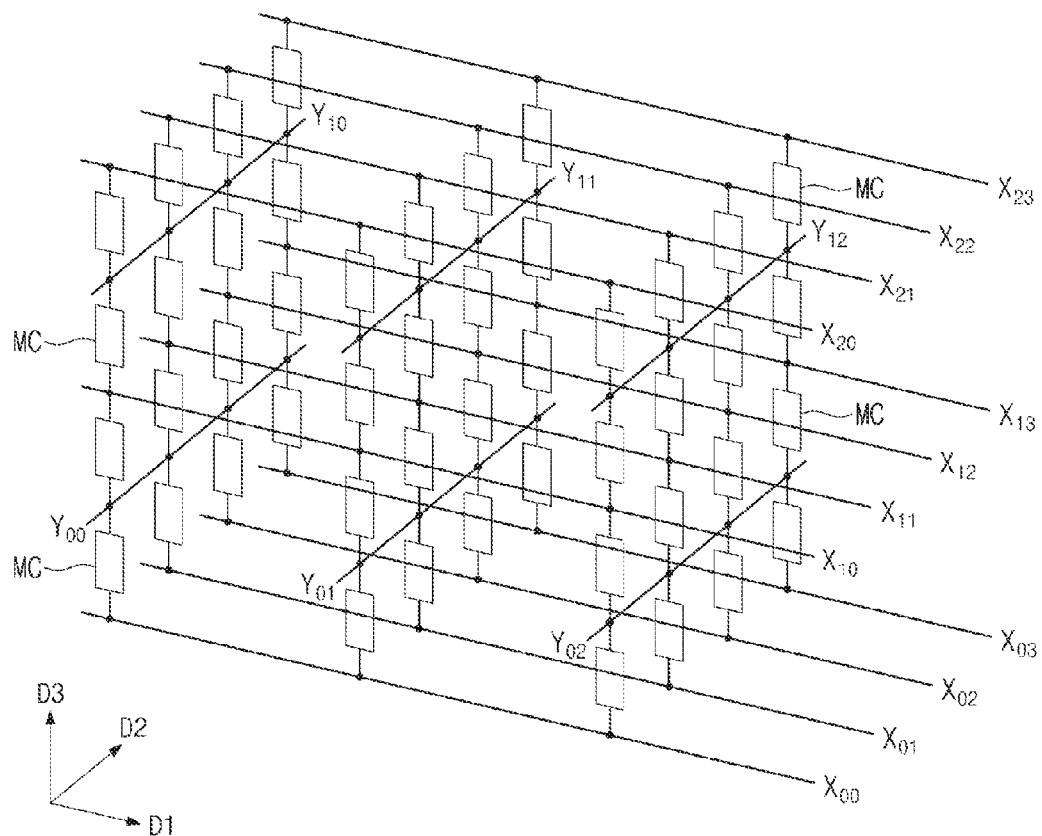
FIG. 3 is a circuit diagram simply illustrating a cell array block of a three-dimensional semiconductor memory device according to exemplary embodiments of the disclosure.

FIG. 2 is a schematic block diagram illustrating a memory cell array of a three-dimensional semiconductor memory device according to exemplary embodiments of the disclosure. FIG. 3 is a circuit diagram simply illustrating a cell array block of a three-dimensional semiconductor memory device according to exemplary embodiments of the disclosure.

Referring to FIGS. 2 and 3, the memory cell array 1 may include a plurality of cell array blocks BLK1, BLK2, . . . , and BLKn.

Each of the cell array blocks BLK1, BLK2, . . . , and BLKn may include a plurality of cell array layers CAL1, CAL2, . . . , and CALn that are stacked along a third direction D3 normal to a plane defined by first and second directions D1 and D2 crossing each other.

In more detail, each of the plurality of cell array layers CAL1, CAL2, . . . , and CALn may include first conductive lines X00 to X03, X10 to X13, and X20 to X23, second conductive lines Y00 to Y02 and Y10 to Y12, and a plurality of memory cells MC respectively disposed at intersections between the first conductive lines X00 to X23 and the second conductive lines Y00 to Y12. The memory cells MC may be arranged along the first and second directions D1 and D2 on each of the cell array layers CAL1, CAL2, . . . , and CALn.

As the cell array layers CAL1, CAL2, . . . , and CALn are stacked along the third direction D3, each of the cell array blocks BLK1, BLK2, . . . , and BLKn may include a plurality of three-dimensionally arranged memory cells MC.

Figure 4:
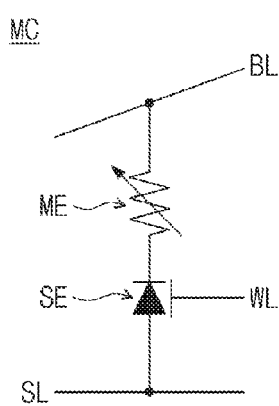
FIG. 4 is a circuit diagram illustrating a unit memory cell of a three-dimensional semiconductor memory device according to exemplary embodiments of the disclosure.

FIG. 4 is a circuit diagram illustrating a unit memory cell of a three-dimensional semiconductor memory device according to exemplary embodiments of the disclosure.

Referring to FIG. 4, the memory cell MC according to exemplary embodiments may be connected to a word line WL, a bit line BL, and a source line SL. The memory cell MC may include a memory element ME and a select element SE, and the select element SE and the memory element ME may be electrically connected in series.

For example, the memory element ME may be connected between the bit line BL and the select element SE, and the select element SE may be connected between the memory element ME and the source line SL. Alternatively, the memory element ME may be connected between the source line SL and the select element SE, and the select element SE may be connected between the memory element ME and the bit line BL.

In some embodiments, the memory element ME may include a variable resistance element that is switched between at least two resistance states by a desired voltage applied between both ends thereof. The variable resistance element may include a material capable of being switched between a plurality of states having resistances different from each other. For example, the variable resistance element may include a phase change material whose resistivity is changed depending on temperature and/or a supply time of heat supplied to the phase change material. Alternatively, the variable resistance element may include a material whose resistance value is changed depending on creation and destruction of a filament and/or bridge. For example, the variable resistance element may include a perovskite compound or a transitional metal oxide. Differently, the variable resistance element may include a magnetic tunnel junction whose resistance value is changed depending on magnetization directions of free and fixed layers.

In some embodiments, the select element SE may be a tunnel field effect transistor (TFET) that uses a band-to-band tunneling phenomenon. The tunnel field effect transistor may include source and drain electrodes whose conductivities are opposite to each other, and a current flow thereof may be controlled by a bias applied to a gate electrode of the tunnel field effect transistor.

In some embodiments, the tunnel field effect transistor may include a p-type source region, an n-type drain region, and a channel region having an intrinsic state between the source and drain regions. In a case that no bias is applied to the source region, the drain region, and the gate electrode in the tunnel field effect transistor or in a case that the tunnel field effect transistor is in a thermal equilibrium state, a p-type Fermi level of the source region and an n-type Fermi level of the drain region may be different from each other so that energy levels of valence and conduction bands may be greater in the source region than in the drain region. In other words, the energy level of the source region may be greater than that of the channel region, and the energy level of the drain region may be less than that of the channel region.

In a case that a reverse bias is applied between the source and drain regions and 0V is applied to the gate electrode in the tunnel field effect transistor (i.e., the tunnel field effect transistor is in a turn-off state where no electric field is applied to the channel region), a high potential barrier may be present between the source and drain regions such that a charge tunneling phenomenon may not occur and a current flow above a threshold current value may not be produced between the source and drain regions. It may merely be possible that a leakage current flow is present between the source and drain regions due to a drift of minority carriers.

In a case that a reverse bias is applied between the source and drain regions and the gate electrode receives a gate voltage above a threshold voltage, for the tunnel field effect transistor (i.e., the tunnel field effect transistor is in a turn-on state where an electric field is applied to the channel region), a potential barrier between the channel region and the source region may become narrow and thus a band-to-band tunneling phenomenon may occur such that electrons quantum-mechanically tunnel from the valence band of the source region into the conduction band of the channel region. A current flow may therefore occur between the source region and the drain region.

As a result, the memory cells according to exemplary embodiments may be switched between on and off states by controlling a voltage applied to the gate electrode under the condition that a reverse bias is provided between the source and drain regions of the tunnel field effect transistor.

The tunnel field effect transistor may control a flow of electrons or holes using the band-to-band tunneling, so it is possible to achieve higher output current (or a drain current) for a small gate voltage (or a small driving voltage). In other words, the tunnel field effect transistor may have a low subthreshold swing.

Figure 5:
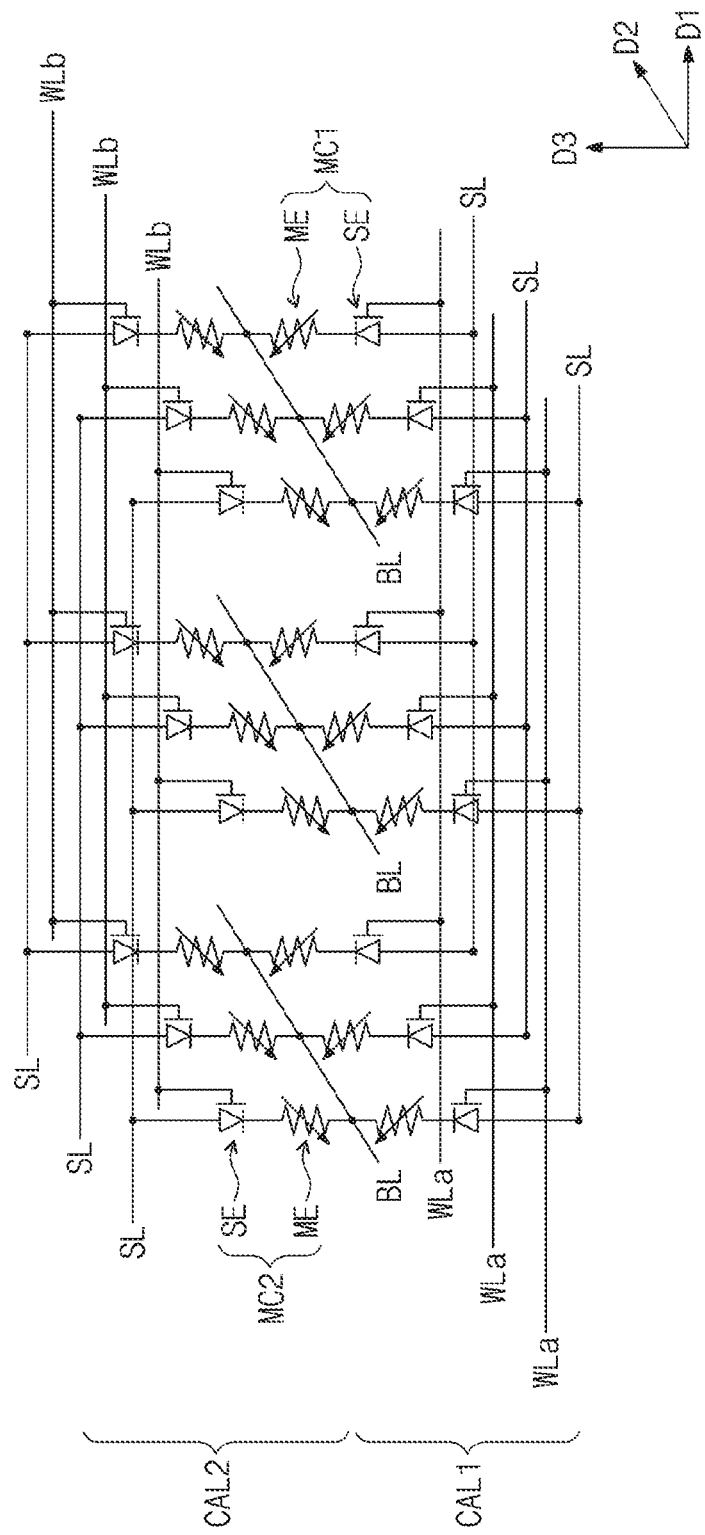
FIGS. 5 and 6 are circuit diagrams illustrating a cell array of a three-dimensional semiconductor memory device according to exemplary embodiments of the disclosure.

FIG. 5 is a circuit diagram illustrating a cell array of a three-dimensional semiconductor memory device according to exemplary embodiments of the disclosure.

Referring to FIG. 5, first and second cell array layers CAL1 and CAL2 and wordline WL first and second directions D1 and D2 are illustrated. In some embodiments, each of the first and second cell array layers CAL1 and CAL2 may include word lines WLa and WLb, bit lines BL, source lines SL, and memory cells MC1 and MC2. Each of the memory cells MC1 and MC2 may be connected to one of the word lines WLa and WLb, one of the bit lines BL, and the source lines SL.

In some embodiments, the bit lines BL may intersect the word lines WLa and WLb, and the memory cells MC1 and MC2 may be provided at intersections between the bit lines BL and the word lines WLa and WLb. The source lines SL may be parallel to the bit lines BL and/or the word lines WLa and WLb. FIG. 5 illustrates that the source lines SL are parallel to the word lines WLa and WLb, but is not limited thereto. Alternatively, the source lines SL may be parallel to the bit lines BL. Furthermore, a plurality of the memory cells MC1 and MC2 may be commonly connected to each of the source lines SL. The source lines SL of FIG. 5 may be separated from each other, but is not limited thereto. In other embodiments, a plurality of memory cells MC1 and MC2 may be commonly connected to a single common source line.

In more detail, the first cell array layer CAL1 may include first memory cells MC1 respectively provided at intersections between the bit lines BL and lower word lines WLa that are crossing each other. The second cell array layer CAL2 may include second memory cells MC2 respectively provided at intersections between the bit lines BL and upper word lines WLb that are crossing each other. As discussed with reference to FIG. 4, each of the first and second memory cells MC1 and MC2 may include a variable resistance element as the memory element ME and a tunnel field effect transistor as the select element SE.

In some embodiments, the lower and upper word lines WLa and WLb may extend along the first direction D1, and the bit lines BL may extend along the second direction D2 crossing the first direction D1.

In some embodiments, the bit lines BL may be shared by the first and second memory cells MC1 and MC2 of the first and second cell array layers CAL1 and CAL2 that are adjacent to each other. In detail, one of the bit lines BL may be shared by the first and second memory cells MC1 and MC2 that are arranged along the second direction D2. For example, one of the bit lines BL may be commonly connected to the memory elements ME of the first and second memory cells MC1 and MC2. Alternatively, one of the bit lines BL may be commonly connected to the memory elements ME of the first memory cells MC1 and the select elements SE of the second memory cells MC2. In certain embodiments, one of the bit lines BL may be commonly connected to the select elements SE of the first and second memory cells MC1 and MC2.

The lower word lines WLa may control the select elements SE of the first memory cells MC1, and the upper word lines WLb may control the select elements SE of the second memory cells MC2. The lower and upper word lines WLa and WLb may be controlled independently from each other, and the bit lines BL may be controlled independently from each other. Therefore, one of the first and second memory cells MC1 and MC2 may be selected by one of the bit lines BL and one of the lower and upper word lines WLa and WLb.

Figure 6:
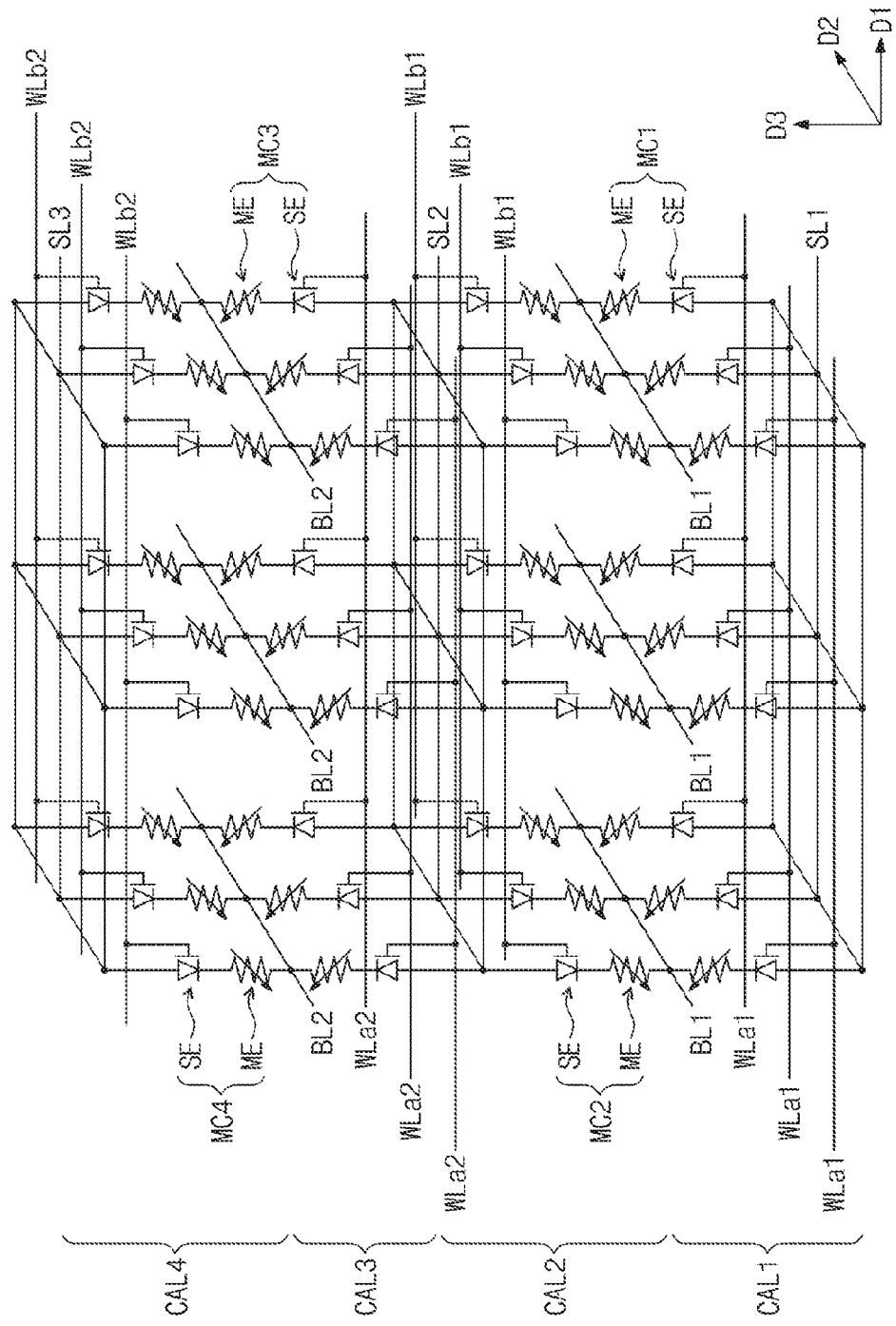

FIG. 6 is a circuit diagram illustrating a cell array of a three-dimensional semiconductor memory device according to exemplary embodiments of the disclosure.

Referring to FIG. 6, first to fourth cell array layers CAL1, CAL2, CAL3 and CAL4 may be sequentially stacked along a third direction D3 perpendicular to a plane defined by first and second directions D1 and D2. In some embodiments, a plurality of the cell array layers CAL1, CAL2, CAL3 and CAL4 may be stacked to alternately share bit lines BL1 and BL2 or source lines SL1 and SL2. In other words, two adjacent ones of cell array layers CAL1, CAL2, CAL3 and CAL4 may commonly share either the bit lines BL1 and BL2 or the source lines SL1 and SL2.

In more detail, the first cell array layer CAL1 may include first memory cells MC1 respectively provided at intersections between first bit lines BL1 and first lower word lines WLa1 that are crossing each other. The first memory cells MC1 may be commonly connected to a first source line SL1.

The second cell array layer CAL2 may include second memory cells MC2 respectively provided at intersections between the first bit lines BL1 and first upper word lines WLb1 that are crossing each other. The second memory cells MC2 may be commonly connected to a second source line SL2. That is, the first bit lines BL1 may be shared by the first and second memory cells MC1 and MC2 of the first and second cell array layers CAL1 and CAL2.

The third cell array layer CAL3 may include third memory cells MC3 respectively provided at intersections between second bit lines BL2 and second lower word lines WLa2 that are crossing each other. The third memory cells MC3 and the second memory cells MC2 may be commonly connected to the second source line SL2.

The fourth cell array layer CAL4 may include fourth memory cells MC4 respectively provided at intersections between the second bit lines BL2 and second upper word lines WLb2 that are crossing each other. The fourth memory cells MC4 may be commonly connected to a third source line SL3. The second bit lines BL2 may be shared by the third and fourth memory cells MC3 and MC4 of the third and fourth cell array layers CAL3 and CAL4.

In some embodiments, as discussed with reference to FIG. 4, each of the first to fourth memory cells MC1 to MC4 may include a variable resistance element as the memory element ME and a tunnel field effect transistor as the select element SE.

For example, the first bit lines BL1 may be shared by the variable resistance elements ME of the first and second memory cells MC1 and MC2, and the second bit lines BL2 may be shared by the variable resistance elements ME of the third and fourth memory cells MC3 and MC4. The second source line SL2 may be commonly connected to the tunnel field effect transistors SE of the second and third memory cells MC2 and MC3.

FIG. 6 schematically illustrates an example in which four cell array layers CAL1, CAL2, CAL3 and CAL4 are stacked, but the disclosure is not limited thereto. For example, the cell array layers CAL1, CAL2, CAL3 and CAL4 may have a structure in which vertically adjacent memory cells MC share either the bit lines BL1 and BL2 or the source lines SL1, SL2 and SL3, and may be repeatedly stacked.

Figure 7:
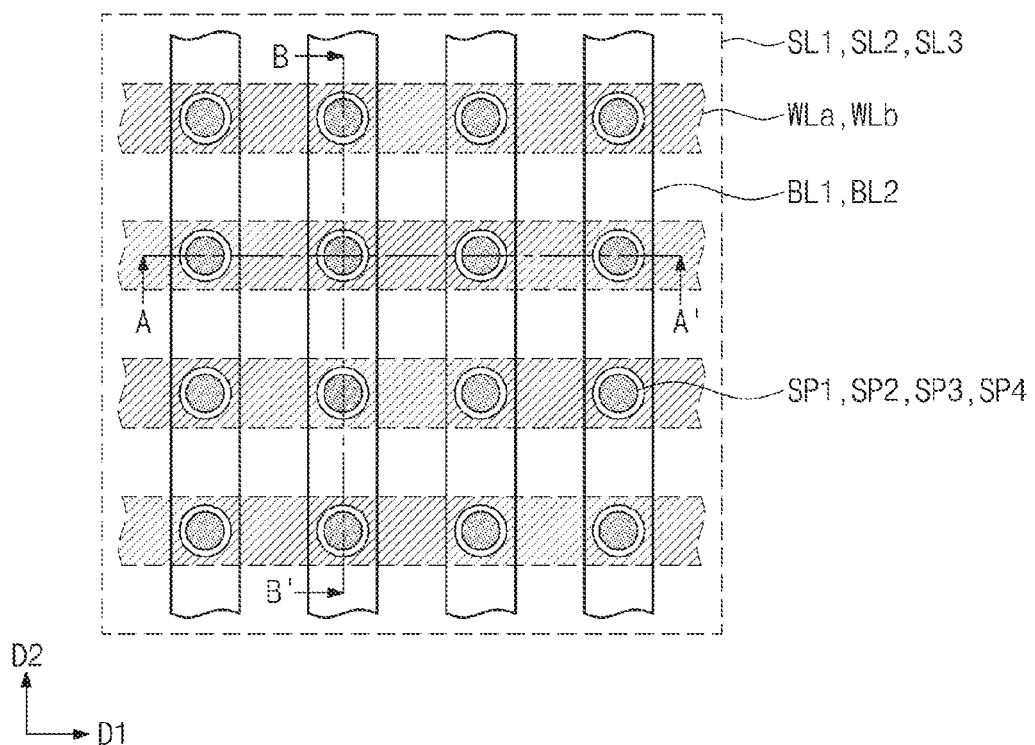
FIG. 7 is a plan view illustrating a three-dimensional semiconductor memory device according to exemplary embodiments of the disclosure.
Figure 8A:
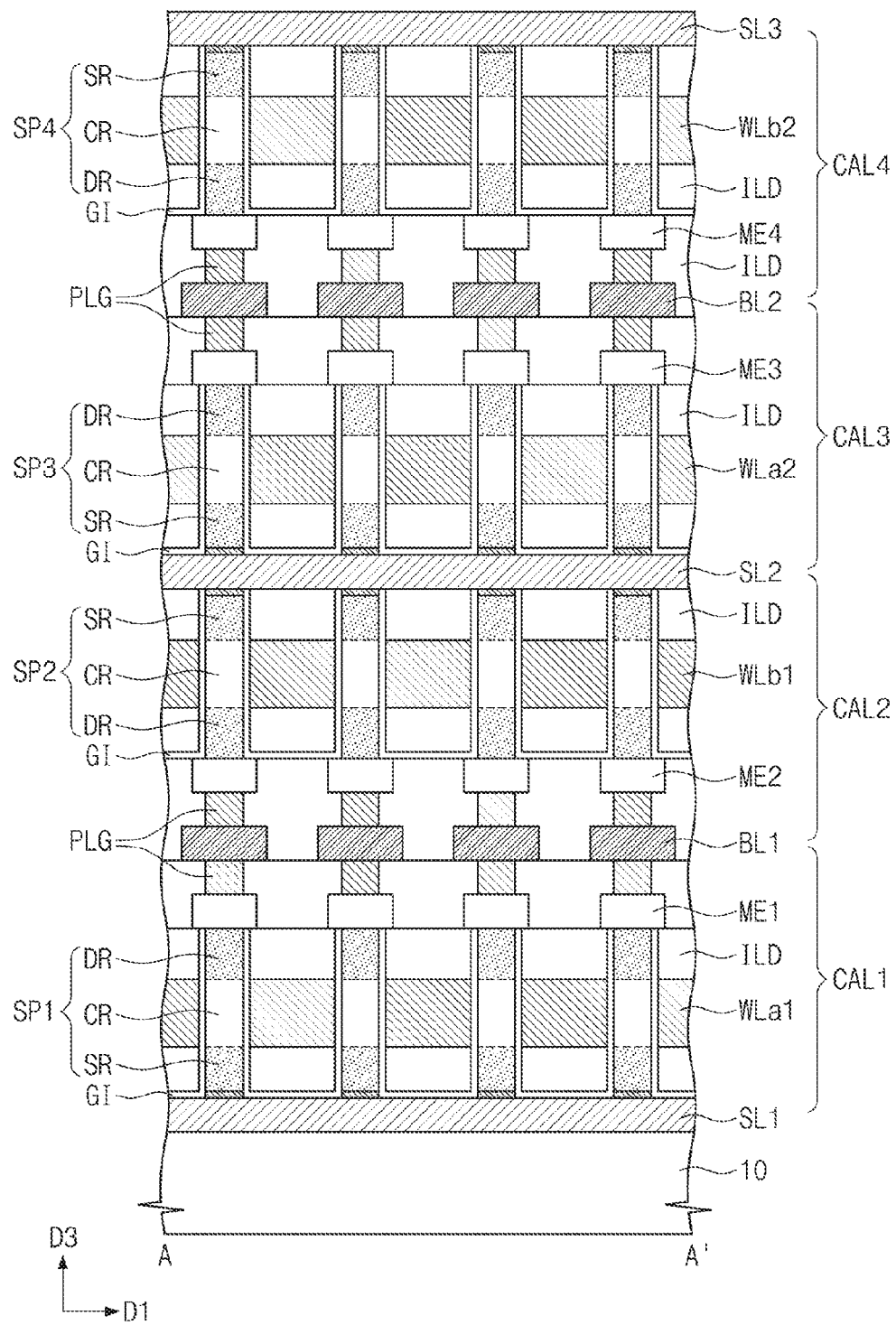
FIGS. 8A and 8B are cross-sectional views taken along lines A-A' and B-B' of FIG. 7, respectively, to illustrate a three-dimensional semiconductor memory device according to exemplary embodiments of the disclosure.
Figure 8B:
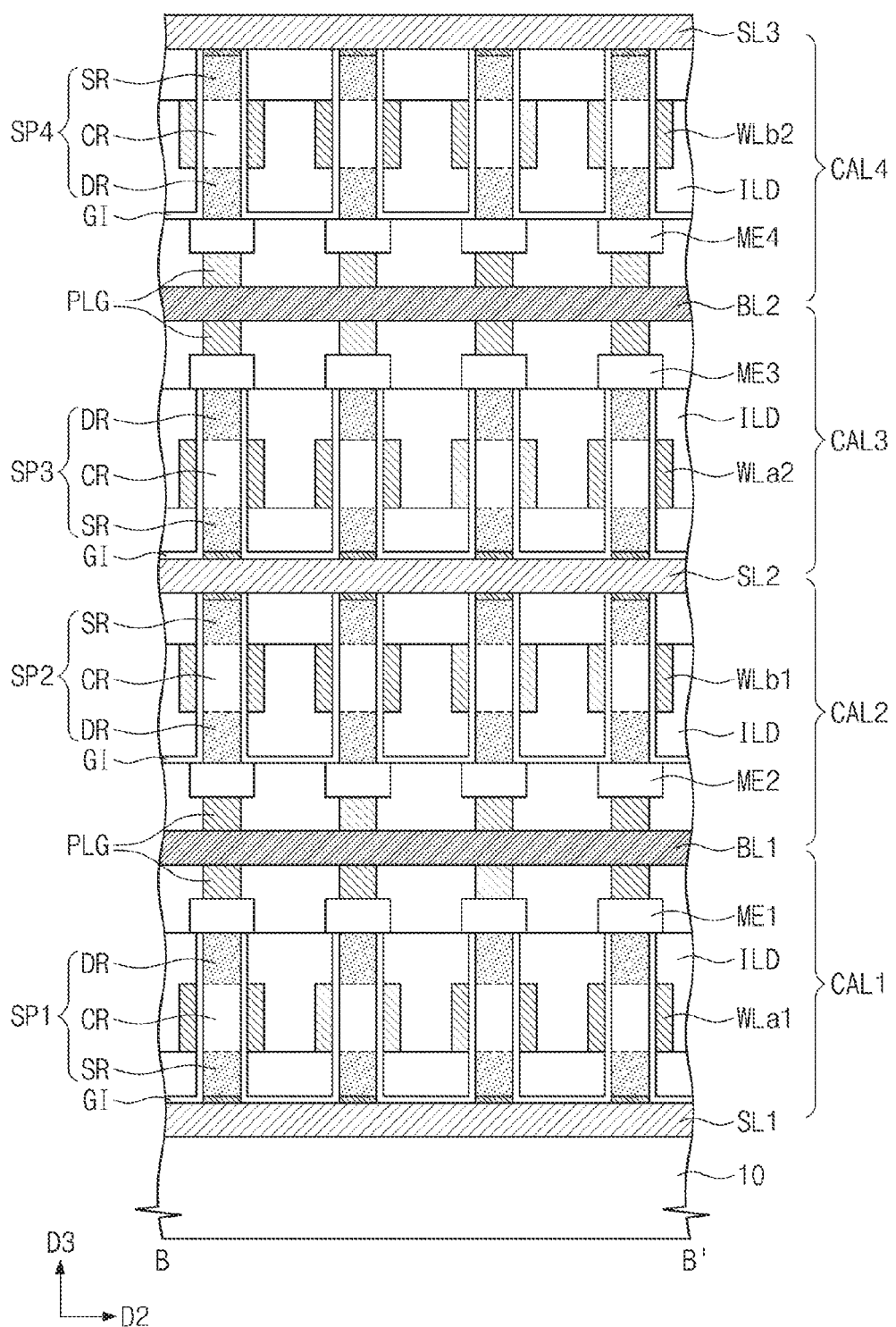
Figure 9:
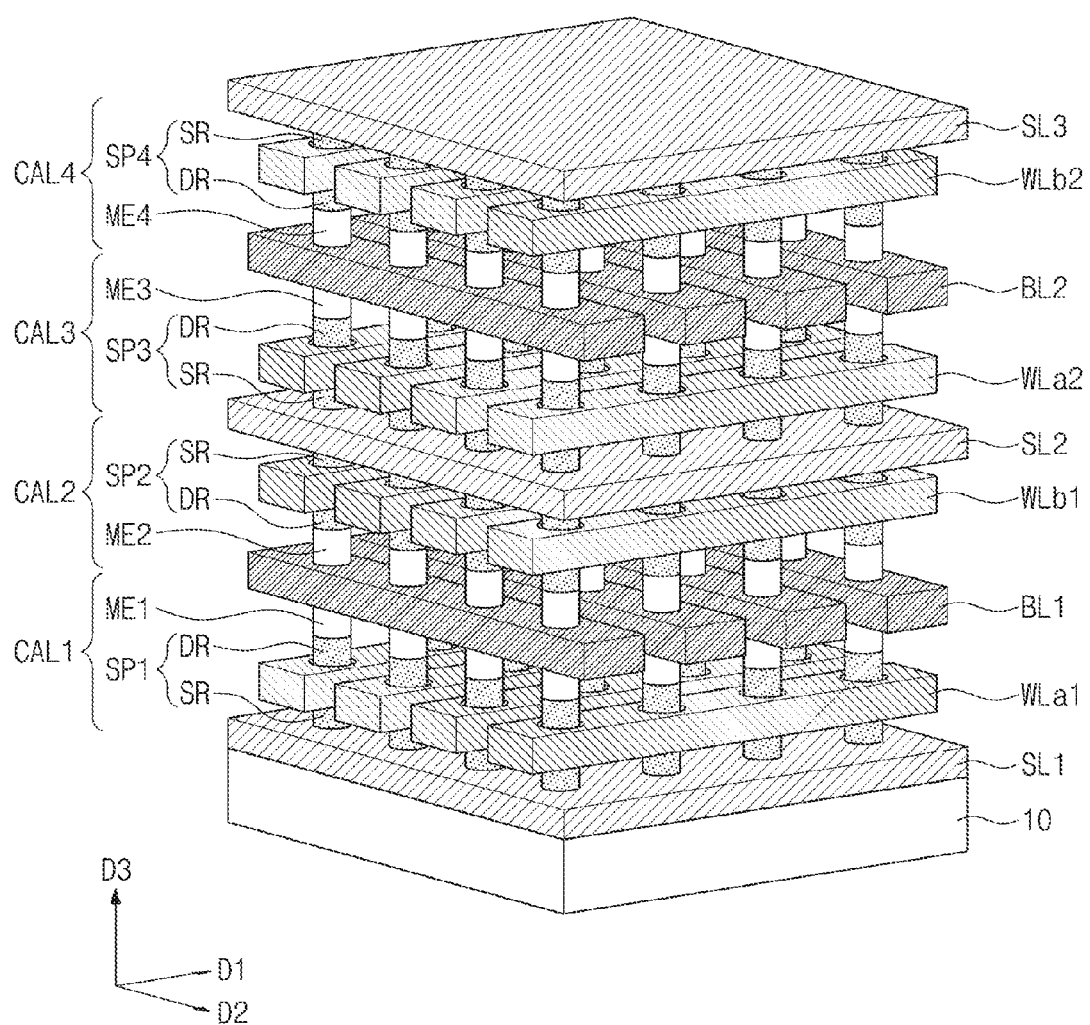
FIGS. 9 and 10 are perspective views illustrating a three-dimensional semiconductor memory device according to exemplary embodiments of the disclosure.
Figure 10:
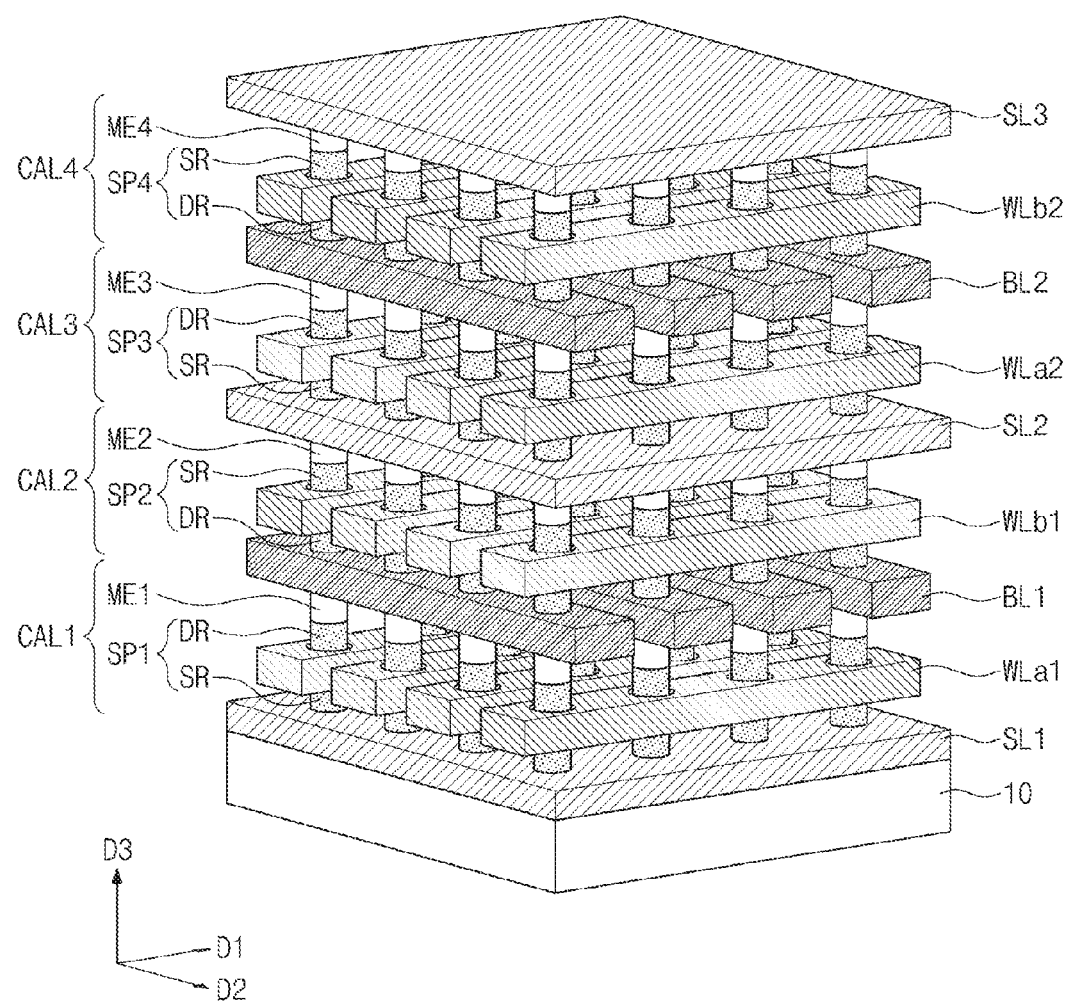

FIG. 7 is a plan view illustrating a three-dimensional semiconductor memory device according to exemplary embodiments of the disclosure. FIGS. 8A and 8B are cross-sectional views taken along lines A-A' and B-B' of FIG. 7, respectively, of a three-dimensional semiconductor memory device according to exemplary embodiments. FIGS. 9 and 10 are perspective views illustrating a three-dimensional semiconductor memory device according to exemplary embodiments of the disclosure.

Referring to FIGS. 7, 8A, 8B, 9 and 10, first to third common source electrodes SL1, SL2 and SL3 may be stacked and vertically spaced apart from each other on a substrate 10. In some embodiments, the substrate 10 may be a semiconductor substrate including silicon, germanium, and/or silicon-germanium. The semiconductor substrate 10 may be a bulk silicon substrate, a silicon on insulator (SOI) substrate, a germanium substrate, a germanium on insulator (GOI) substrate, a silicon-germanium substrate, or an epitaxial layer substrate obtained by performing a selective epitaxial growth (SEG). In this description, the common source electrode may correspond to the source line formerly discussed. The term of common source electrode may be interchangeably used with the term of source line.

For example, the first to third common source electrodes SL1 to SL3 may have a plate shape or alternatively a line shape. The first to third common source electrodes SL1 to SL3 may include at least one of a doped semiconductor material (e.g., doped silicon, etc), metal (e.g., tungsten, aluminum, titanium, and/or tantalum), a conductive metal nitride (e.g., titanium nitride, tantalum nitride, and/or tungsten nitride), and a metal-semiconductor compound (e.g., metal silicide).

In more detail, the first common source electrode SL1 may be disposed on a top surface of the substrate 10. The first common source electrode SL1 may be formed by depositing and patterning a conductive layer, or by doping impurities into the substrate 10 composed of a semiconductor material. For example, in case that the first common source electrode SL1 is formed of a metal material, the first common source electrode SL1 may be formed on an insulation layer (not shown). The second and third common source electrodes SL2 and SL3 may be formed by depositing and patterning a conductive layer on an interlayer dielectric layer ILD.

In some embodiments, first and second cell array layers CAL1 and CAL2 may be provided between the first common source electrode SL1 and the second common source electrode SL2, and each of the first and second cell array layers CAL1 and CAL2 may include memory cells arranged in a matrix fashion.

In more detail, first lower word lines WLa1, first bit lines BL1, and first upper word lines WLb1 may be stacked between the first and second common source electrodes SL1 and SL2 that are vertically adjacent to each other. The first lower word lines WLa1 may extend in a first direction D1 at a first height from the top surface of the substrate 10, and the first upper word lines WLb1 may extend in the first direction D1 at a second height greater than the first height from the top surface of the substrate 10. The first bit lines BL1 may be disposed at a third height greater than the first height and less than the second height, and may extend in a second direction D2 to run across the first lower and upper word lines WLa1 and WLb1.

Each of the first lower word lines WLa1 may run across sidewalls of first semiconductor pillars SP1 arranged along the first direction D1. For example, the first lower word lines WLa1 may surround channel regions CR of the first semiconductor pillars SP1 while extending in the first direction D1. That is, the first semiconductor pillars SP1 may penetrate the first lower word lines WLa1. A gate dielectric layer GI may be disposed between the first lower word lines WLa1 and the first semiconductor pillars SP1 and may surround the sidewalls of the first semiconductor pillars SP1. The gate dielectric layer GI may be interposed between the first lower word lines WLa1 and the first semiconductor pillars SP1. The gate dielectric layer GI may vertically extend into source and drain regions SR and DR from the channel region CR. The gate dielectric layer GI may include oxide (e.g., silicon oxide), nitride (e.g., silicon nitride), oxynitride (e.g., silicon oxynitride), and/or a high-k dielectric layer (e.g., insulative metal oxide such as hafnium oxide or aluminum oxide). An interlayer dielectric layer ILD may fill between the first lower word lines WLa1 and between the first semiconductor pillars SP1. In some embodiments, the first lower word lines WLa1 and the first semiconductor pillars SP1 may constitute the tunnel field effect transistors of the first memory cells discussed with reference to FIG. 6.

Each of the first upper word lines WLb1 may run across sidewalls of the second semiconductor pillars SP2 arranged along the first direction D1. For example, the first upper word lines WLb1 may surround channel regions CR of the second semiconductor pillars SP2 while extending in the first direction D1. That is, the second semiconductor pillars SP2 may penetrate the first upper word lines WLb1. A gate dielectric layer GI may be disposed between the first upper word lines WLb1 and the second semiconductor pillars SP2 and may surround the sidewalls of the second semiconductor pillars SP2. The first upper word lines WLb1 and the second semiconductor pillars SP2 may constitute the tunnel field effect transistors of the second memory cells discussed with reference to FIG. 6.

In some embodiments, as viewed in plan, first variable resistance elements ME1 and the first semiconductor pillars SP1 may be respectively disposed at intersections between the first lower word lines WLa1 and the first bit lines BL1. As viewed in plan, second variable resistance elements ME2 and the second semiconductor pillars SP2 may be respectively disposed at intersections between the first upper word lines WLb1 and the first bit lines BL1.

For example, the first semiconductor pillars SP1 may be spaced apart from each other along the first and second directions D1 and D2 on the first common source electrode SL1. The second semiconductor pillars SP2 may be disposed spaced apart from each other on each of the first bit lines BL1.

The first and second semiconductor pillars SP1 and SP2 may include silicon (Si), germanium (Ge), or a mixture thereof. The first and second semiconductor pillars SP1 and SP2 may include at least one selected from a single crystalline structure, an amorphous structure, and a polycrystalline structure.

The first and second semiconductor pillars SP1 and SP2 may be perpendicular to the top surface of the substrate 10, and each of the first and second semiconductor pillars SP1 and SP2 may include source and drain regions SR and DR having conductivities opposite to each other. In more detail, each of the first and second semiconductor pillars SP1 and SP2 may include the source region SR and the drain region DR that are vertically spaced apart from each other and further include the channel region CR between the source and drain regions SR and DR. The source region SR may include highly doped p-type impurities, and the drain region DR may include highly doped n-type impurities. The channel region CR may be doped with impurities or may have an intrinsic state.

In some embodiments, the source regions SR of the first semiconductor pillars SP1 may be commonly connected to the first common source electrode SL1. In a case that the first common source electrode SL1 includes a metal material, an ohmic contact layer may be disposed between the first semiconductor pillars SP1 and the first common source electrode SL1. The ohmic contact layer may include a metal-semiconductor compound (e.g., metal silicide such as cobalt silicide or titanium silicide).

The source regions SR of the second semiconductor pillars SP2 may be commonly connected to the second common source electrode SL2. An ohmic contact layer may be disposed between the second semiconductor pillars SP2 and the second common source electrode SL2.

The first variable resistance elements ME1 may be disposed between the first semiconductor pillars SP1 and the first bit lines BL1. The first variable resistance elements ME1 may be coupled to the drain regions DR of the first semiconductor pillars SP1, and electrically connected to the first bit lines BL1 through contact plugs PLG provided between the first variable resistance elements ME1 and the first bit lines BL1.

The first variable resistance elements ME1 may be formed of at least one of materials having physical properties capable of storing data. In a case that a phase change memory device is adopted as a variable resistance memory device according to exemplary embodiments of the disclosure, the first variable resistance elements ME1 may include a material whose phase is reversibly changed between a crystalline state and an amorphous state depending on its temperature. Alternatively, the first variable resistance elements ME1 may include at least one of perovskite compounds or conductive metal oxides. The first variable resistance elements ME1 will be further discussed in detail with reference to FIGS. 11A and 11B.

According to an embodiment, as shown in FIG. 9, the second variable resistance elements ME2 may be disposed between the second semiconductor pillars SP2 and the first bit lines BL1. In other words, the second variable resistance elements ME2 may be coupled to the drain regions DR of the second semiconductor pillars SP2, and electrically connected to the first bit lines BL1 through contact plugs PLG provided between the first bit lines BL1 and the second variable resistance elements ME2. According to other embodiment, as shown in FIG. 10, the second variable resistance elements ME2 may be disposed between the second semiconductor pillars SP2 and the second common source electrode SL2. In some embodiments, substantially identically to the first variable resistance elements ME1, the second variable resistance elements ME2 may be formed of a variable resistance material that is switched between two resistance states by an electrical pulse.

For example, as shown in FIG. 9, the second semiconductor pillars SP2 may be mirror-symmetrically disposed to the first semiconductor pillars SP1 across the first bit lines BL1. The source regions SR of the second semiconductor pillars SP2 may be commonly connected to the second common source electrode SL2. In a case that the second common source electrode SL2 includes a metal material, an ohmic contact layer may be disposed between the second semiconductor pillars SP2 and the second common source electrode SL2. In other words, the second cell array layer CAL2 may be mirror-symmetrically disposed to the first cell array layer CAL1 across the first bit lines BL1.

Alternatively, as shown in FIG. 10, the second semiconductor pillars SP2 may be asymmetrically disposed to the first semiconductor pillars SP1 across the first bit lines BL1. For example, the second semiconductor pillars SP2 may be disposed on the first bit lines BL1 such that the drain regions DR of the second semiconductor pillars SP2 may be connected to the first bit lines BL1. In this case, an ohmic contact layer may be disposed between second semiconductor pillars SP2 and the first bit lines BL1. In other words, the second cell array layer CAL2 may be asymmetrically disposed to the first cell array layer CAL1 across the first bit lines BL1.

In some embodiments, third and fourth cell array layers CAL3 and CAL4 may be provided between the second common source electrode SL2 and the third common source electrode SL3. The third and fourth cell array layers CAL3 and CAL4 may have substantially the same stacking structure as the first and second cell array layers CAL1 and CAL2. For example, as shown in FIG. 9, the third cell array layer CAL3 may be mirror-symmetrically disposed to the second cell array layer CAL2 across the second common source electrode SL2. The fourth cell array layer CAL4 may be mirror-symmetrically disposed to the third cell array layer CAL3 across the second bit lines BL2.

In detail, second lower word lines WLa2, second bit lines BL2, and second upper word lines WLb2 may be stacked between the second and third common source electrodes SL2 and SL3 that are vertically adjacent to each other.

The second lower word lines WLa2 may extend in the first direction D1 at a first height from the second common source electrode SL2, and the second upper word lines WLb2 may extend in the first direction D1 at a second height greater than the first height from the second common source electrode SL2. In other words, as viewed in section, the second bit lines BL2 may be disposed between the second lower and upper word lines WLa2 and WLb2, and may extend in the second direction D2 to run across the second lower and upper word lines WLa2 and WLb2.

A plurality of the third semiconductor pillars SP3 may be disposed spaced apart from each other along the first direction D1 and the second direction D2 on the second common source electrodes SL2. As viewed in plan, the third semiconductor pillars SP3 may be respectively disposed at intersections between the second lower word lines WLa2 and the second bit lines BL2. For example, the third semiconductor pillars SP3 may penetrate the second lower word lines WLa2.

As viewed in plan, a plurality of the fourth semiconductor pillars SP4 may be respectively disposed at intersections between the second upper word lines WLb2 and the second bit lines BL2. The fourth semiconductor pillars SP4 may be disposed spaced apart from each other on each of the second bit lines BL2. For example, the fourth semiconductor pillars SP4 may penetrate the second upper word lines WLb2.

Like the first and second semiconductor pillars SP1 and SP2, each of the third and fourth semiconductor pillars SP3 and SP4 may include source and drain regions SR and DR having conductivities opposite to each other and further include a channel region CR between the source and drain regions SR and DR. The third and fourth semiconductor pillars SP3 and SP4 may include at least one selected from a single crystalline structure, an amorphous structure, and a polycrystalline structure. In some embodiments, the third and fourth semiconductor pillars SP3 and SP4 may be perpendicular to the top surface of the substrate 10, and the source and drain regions SR and DR may be vertically spaced apart from each other.

According to an embodiment, as shown in FIG. 9, the fourth semiconductor pillars SP4 may be mirror symmetrically disposed to the third semiconductor pillars SP3 across the second bit lines BL2. The source regions SR of the fourth semiconductor pillars SP4 may be commonly connected to the third common source electrode SL3. Alternatively, as shown in FIG. 10, the fourth semiconductor pillars SP4 may be disposed on the second bit lines BL2 such that the drain regions DR of the fourth semiconductor pillars SP4 may be connected to the second bit lines BL2.

Each of the second lower word lines WLa2 may run across sidewalls of the third semiconductor pillars SP3 arranged along the first direction D1. For example, the second lower word lines WLa2 may surround the channel regions CR of the third semiconductor pillars SP3. A gate dielectric layer GI may be interposed between the third semiconductor pillars SP3 and the second lower word lines WLa2. The second lower word lines WLa2 and the third semiconductor pillars SP3 may constitute the tunnel field effect transistors of the third memory cells discussed with reference to FIG. 6.

Each of the second upper word lines WLb2 may run across sidewalls of the fourth semiconductor pillars SP4 arranged along the first direction D1. In an embodiment, the second upper word lines WLb2 may surround the channel regions CR of the fourth semiconductor pillars SP4, and a gate dielectric layer GI may be interposed between the fourth semiconductor pillars SP4 and the second upper word lines WLb2. The second upper word lines WLb2 and the fourth semiconductor pillars SP4 may constitute the tunnel field effect transistors of the fourth memory cells discussed with reference to FIG. 6.

Third variable resistance elements ME3 may be disposed between the third semiconductor pillars SP3 and the second bit lines BL2. The third variable resistance elements ME3 may be respectively connected to the drain regions DR of the third semiconductor pillars SP3. One of the second bit lines BL2 may be electrically connected to the third variable resistance elements ME3 arranged along the second direction D2 through contact plugs PLG provided between the third variable resistance elements ME3 and the second bit lines BL2. The third variable resistance elements ME3 may be formed of the same variable resistance material as the first and second variable resistance elements ME1 and ME2.

For example, as shown in FIG. 9, the fourth variable resistance elements ME4 may be disposed between the fourth semiconductor pillars SP4 and the second bit lines BL2, and may be formed of the same variable resistance material as the first to third variable resistance elements ME1 to ME3. Each of the second bit lines BL2 may be commonly connected to the third and fourth variable resistance elements ME3 and ME4 arranged along the second direction D2.

According to exemplary embodiments of the disclosure, the substrate 10 may be provided thereon with the first to fourth semiconductor pillars SP1 to SP4 that are three-dimensionally arranged to constitute the tunnel field effect transistors of the first to fourth memory cells MC1 to MC4 discussed with reference to FIG. 6. Since the tunnel field effect transistors having a low subthreshold swing are used as select elements of the memory cells arranged three-dimensionally, physical properties (e.g., a crystalline structure, etc) of the first to fourth semiconductor pillars SP1 to SP4 may have a reduced effect on electrical characteristics of the tunnel field effect transistors. It may then be possible to accomplish tunnel field effect transistors using an amorphous semiconductor material that is formed at a low temperature process.

Alternatively, as shown in FIG. 10, the fourth variable resistance elements ME4 may be disposed between the fourth semiconductor pillars SP4 and the third common source electrode SL3, and each of the second bit lines BL2 may be commonly connected to the drain regions DR of the fourth semiconductor pillars SP4 and the third variable resistance elements ME3 arranged along the second direction D2.

Figure 11A:
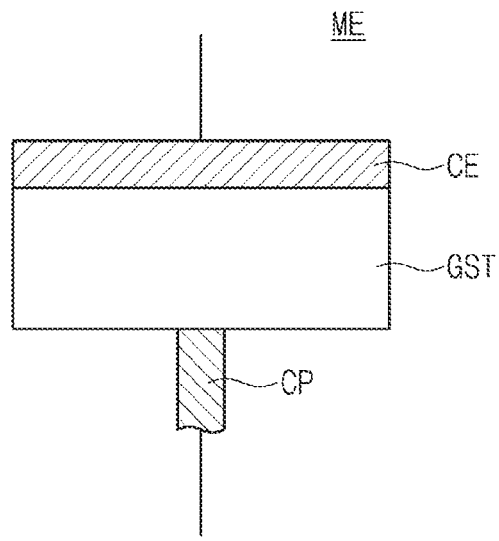
FIGS. 11A and 11B are cross-sectional views illustrating examples of a variable resistance element of a semiconductor memory device according to exemplary embodiments of the disclosure.
Figure 11B:
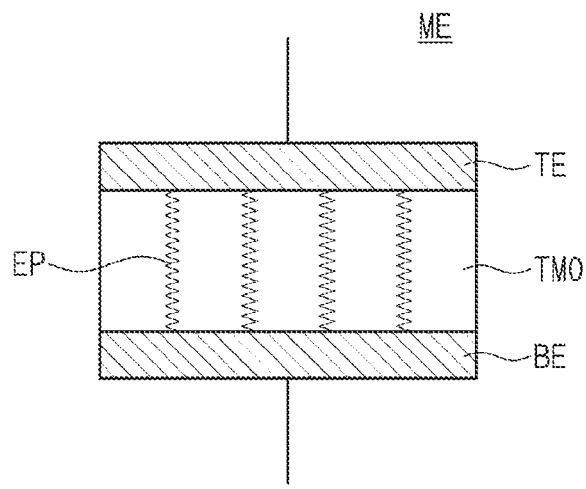

FIGS. 11A and 11B show a variable resistance element of a semiconductor memory device according to exemplary embodiments of the disclosure.

Referring to FIG. 11A, a variable resistance element ME may include a phase change material pattern GST and a capping electrode CE that are sequentially stacked. The phase change material pattern GST may be switched between crystalline and amorphous states depending on a temperature and/or supply time of heat supplied to thereto. The phase change material pattern GST may have a lower resistivity in the crystalline state than in the amorphous state. The variable resistance element ME may store data using a resistivity difference resulting from the phase change. In some embodiments, a cell contact plug CP may be provided as a heater electrode in contact with the phase change material pattern GST. In this case, the phase change material pattern GST may have a program region at its portion adjacent to the cell contact plug CP. The program region may be changed to one of crystalline and amorphous states.

The phase change material pattern GST may include at least one selected from chalcogenide elements, such as tellurium (Te) and selenium (Se). For example, the phase change material pattern GST may include at least one selected from Ge—Sb—Te, As—Sb—Te, As—Ge—Sb—Te, Sn—Sb—Te, Ag—In—Sb—Te, In—Sb—Te, 5A group element-Sb—Te, 6A group element-Sb—Te, 5A group element-Sb—Se, 6A group element-Sb—Se, Ge—Sb, In—Sb, Ga—Sb, and doped Ge—Sb—Te. The doped Ge—Sb—Te may be doped with at least one of C, N, B, Bi, Si, P, Al, Dy, and Ti. The capping electrode CE and the cell contact plug CP may include at least one of a doped semiconductor material (e.g., doped silicon, etc), metal (e.g., tungsten, aluminum, titanium, and/or tantalum), a conductive metal nitride (e.g., titanium nitride, tantalum nitride, and/or tungsten nitride), and a metal-semiconductor compound (e.g., metal silicide).

According to an embodiment illustrated in FIG. 11B, the variable resistance element ME may include a bottom electrode BE, a top electrode TE, and a transition metal oxide pattern TMO interposed between the bottom electrode BE and the top electrode TE. A program operation may create or destroy at least one electrical path EP in the transition metal oxide pattern TMO. The electrical path EP may have opposite ends respectively connected to the bottom and top electrodes BE and TE. The variable resistance element ME may have a low resistance value when the electrical path EP is created, and may have a high resistance value when the electrical path EP is destroyed. The variable resistance element ME may store data using a resistance difference resulting from creation and destruction of the electrical path EP. The electrical path EP may be created or destroyed by the program operation.

In certain embodiments, the variable resistance element ME may include at least one of perovskite compounds or transition metal oxides.

For example, the transition metal oxide pattern TMO may include at least one of niobium oxide, titanium oxide, nickel oxide, zirconium oxide, vanadium oxide, PCMO ((Pr,Ca)MnO3), strontium-titanium oxide, barium-strontium-titanium oxide, strontium-zirconium oxide, barium-zirconium oxide, and barium-strontium-zirconium oxide.

The bottom and top electrodes BE and TE may include at least one of a conductive metal nitride (e.g., titanium nitride, tantalum nitride, etc), a transition metal (e.g., titanium, tantalum, etc), and a rare earth metal (e.g., ruthenium, platinum, etc).

In another embodiment, not shown in the figures, the variable resistance element ME may be formed to have a thin film structure whose electrical resistance can be changed using a spin transferring phenomenon of an electrical current flowing through the variable resistance element ME. For example, the variable resistance element ME may have a thin film structure configured to exhibit a magneto-resistance property and may include at least one ferromagnetic material and/or at least one antiferromagnetic material.

Figure 12A:
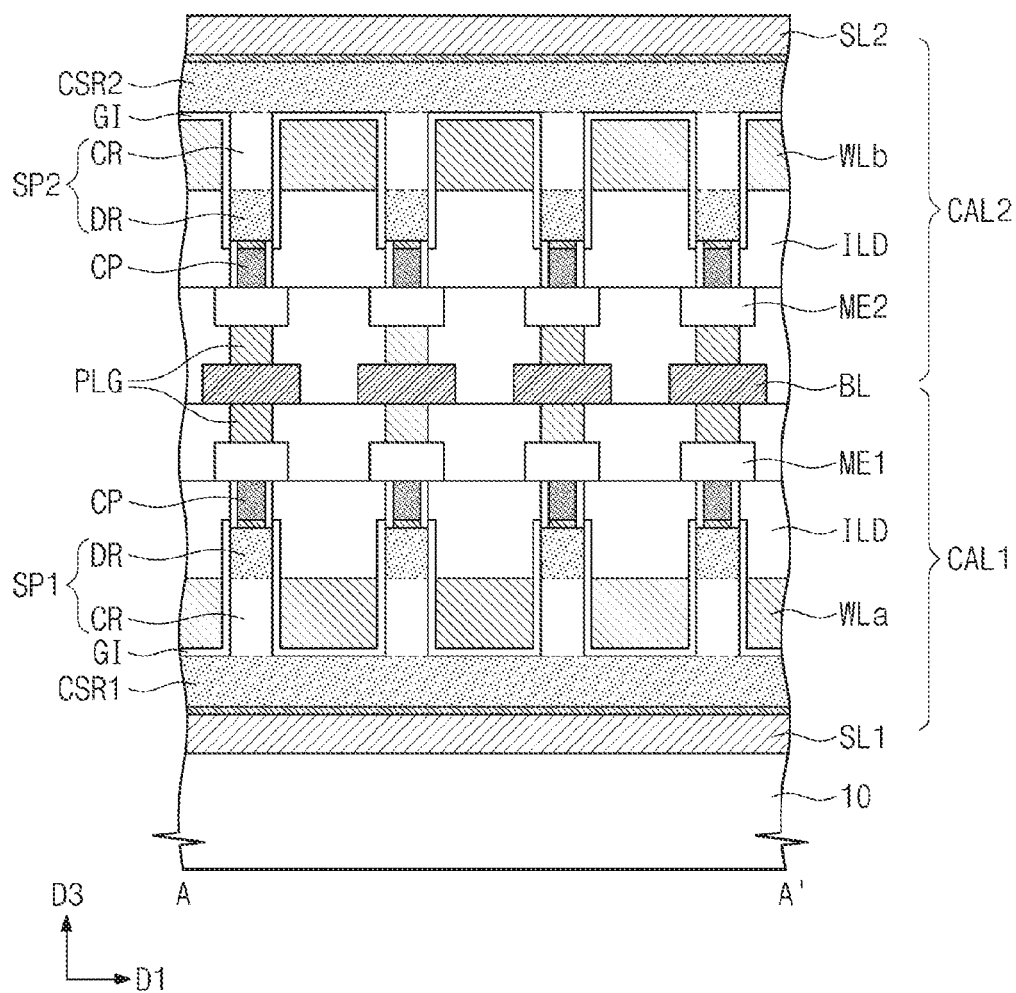
FIGS. 12A and 12B are cross-sectional views taken along lines A-A' and B-B' of FIG. 7, respectively, to illustrate a three-dimensional semiconductor memory device according to exemplary embodiments of the disclosure.
Figure 12B:
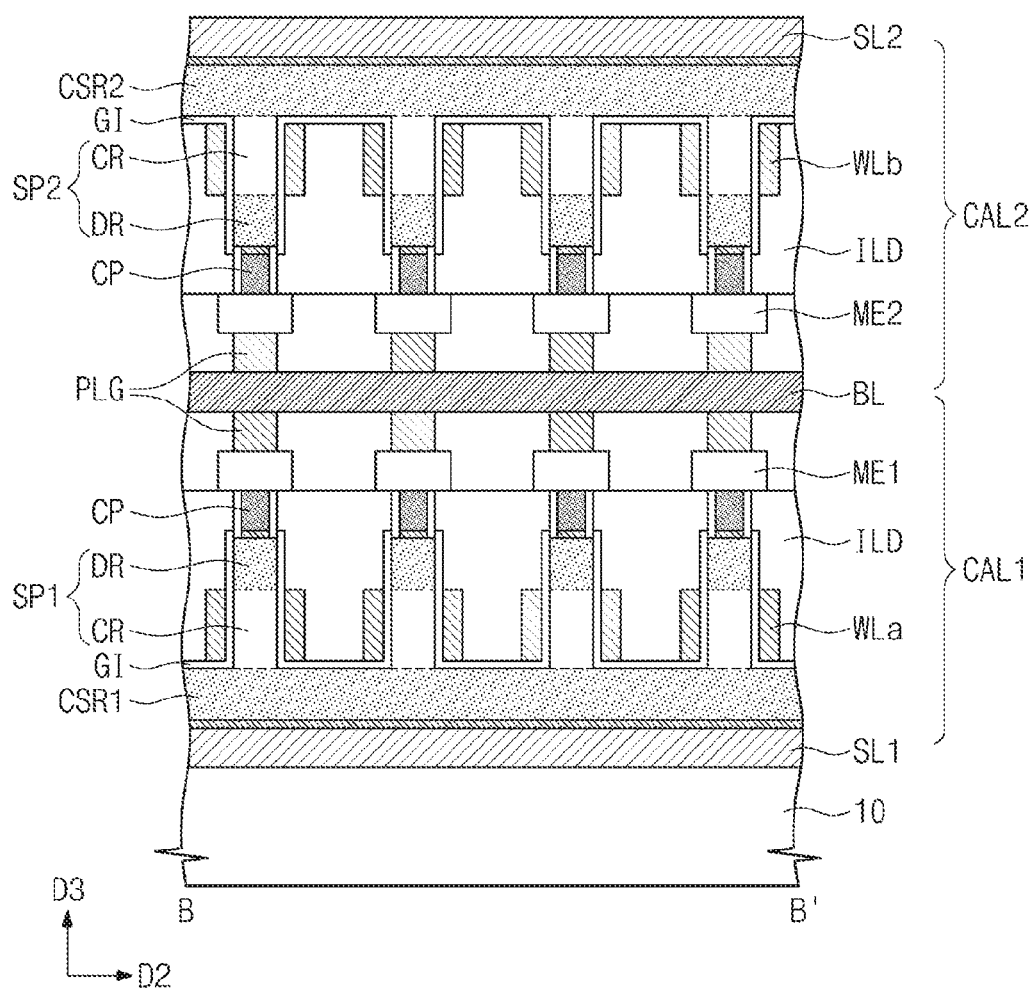

FIGS. 12A and 12B are cross-sectional views taken along lines A-A' and B-B' of FIG. 7, respectively, of a three-dimensional semiconductor memory device according to exemplary embodiments. Configurations substantially the same as those of the three-dimensional semiconductor memory device explained with reference to FIGS. 7, 8A, 8B, 9 and 10 are allocated the same reference numerals thereto, and repetitive descriptions may be omitted herein in the interest of brevity.

Referring to FIGS. 12A and 12B, first and second common source electrodes SL1 and SL2 may be disposed vertically spaced apart from each other on a substrate 10. First and second cell array layers CAL1 and CAL2 may be disposed between the first and second common source electrodes SL1 and SL2, and may share bit lines BL as discussed above.

In some embodiments, the first common source electrode SL1 may be provided thereon with a first semiconductor layer CSR1 and a plurality of first semiconductor pillars SP1 vertically protruding from the first semiconductor layer CSR1. As viewed in plan, the first semiconductor pillars SP1 may be disposed spaced apart from each other in first and second directions D1 and D2, and the first semiconductor layer CSR1 may be commonly connected to the first semiconductor pillars SP1. The first semiconductor layer CSR1 may have a plate shape like the first common source electrode SL1, or alternatively may have a line shape.

The first semiconductor layer CSR1 may be doped with high concentration p-type impurities so as to reduce an ohmic resistance between the first common source electrode SL1 and the first semiconductor layer CSR1. In addition, an ohmic contact layer may be interposed between the first semiconductor layer CSR1 and the first common source electrode SL1.

The first semiconductor pillars SP1 may include drain regions DR vertically spaced apart from the first semiconductor layer CSR1. The drain regions DR may be impurity regions where n-type impurities are highly doped. The first semiconductor pillars SP1 may include, below the drain regions DR, channel regions CR adjacent to the first semiconductor layer CSR1.

Lower word lines WLa may be provided on the first semiconductor layer CSR1 and may run across the channel regions CR of the first semiconductor pillars SP1. A gate dielectric layer GI may be interposed between the lower word lines WLa and the first semiconductor pillars SP1. The gate dielectric layer GI may be formed to surround sidewalls of the first semiconductor pillars SP1. In some embodiments, the gate dielectric layer GI may extend from between the lower word lines WLa and the first semiconductor pillars SP into between the first semiconductor layer CSR1 and the lower word lines WLa.

First variable resistance elements ME1 may be respectively disposed between the first semiconductor pillars SP1 and the bit lines BL, and contact structures CP may be respectively disposed between the first variable resistance elements ME1 and the drain regions DR of the first semiconductor pillars SP1. The contact structure CP may be formed by sequentially forming a spacer insulation layer and a conductive layer in each of contact holes that penetrate an interlayer dielectric layer ILD and respectively expose the first semiconductor pillars SP1.

A plurality of upper word lines WLb may be provided to extend in the first direction D1 on the bit lines BL, and a plurality of second semiconductor pillars SP2 may be respectively disposed on intersections between the upper word lines WLb and the bit lines BL and may thus penetrate the upper word lines WLb.

In some embodiments, the second semiconductor pillar SP2 may include a drain region DR and a channel region CR that are arranged symmetrically to those of the first semiconductor pillar SP1 across the bit line BL. That is, the drain regions DR of the second semiconductor pillars SP2 may be adjacent to the bit lines BL.

Second variable resistance elements ME2 may be respectively disposed between the bit lines BL and the second semiconductor pillars SP2, and contact structures CP may be respectively disposed between the second variable resistance elements ME2 and the drain regions DR of the second semiconductor pillars SP2.

According to some embodiments, a second semiconductor layer CSR2 may be disposed on the upper word lines WLb and the second semiconductor pillars SP2. The second semiconductor pillars SP2 may be all covered with and commonly connected to the second semiconductor layer CSR2. The second semiconductor layer CSR2 may be a common source region doped with p-type impurities and spaced apart from the drain regions DR of the second semiconductor pillars SP2.

The second semiconductor layer CSR2 may be electrically connected to the second common source electrode SL2, and doped with high concentration p-type impurities so as to reduce an ohmic resistance between the second semiconductor layer CSR2 and the second common source electrode SL2. In addition, an ohmic contact layer may be interposed between the second semiconductor layer CSR2 and the second common source electrode SL2.

In an embodiment, a gate dielectric layer GI may be interposed between the second semiconductor pillars SP2 and the upper word lines WLb, and may extend between the upper word lines WLb and the second semiconductor layer CSR2.

Figure 13:
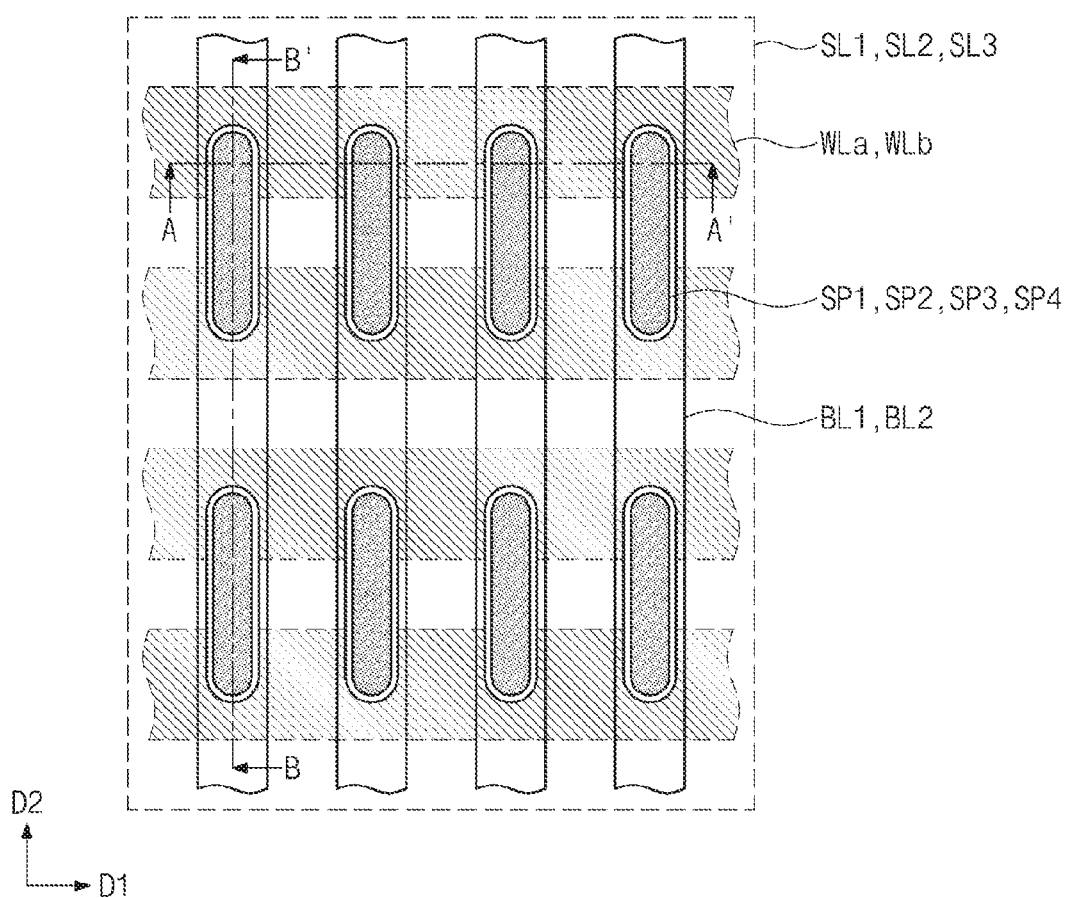
FIG. 13 is a plan view illustrating a three-dimensional semiconductor memory device according to exemplary embodiments of the disclosure.
Figure 14A:
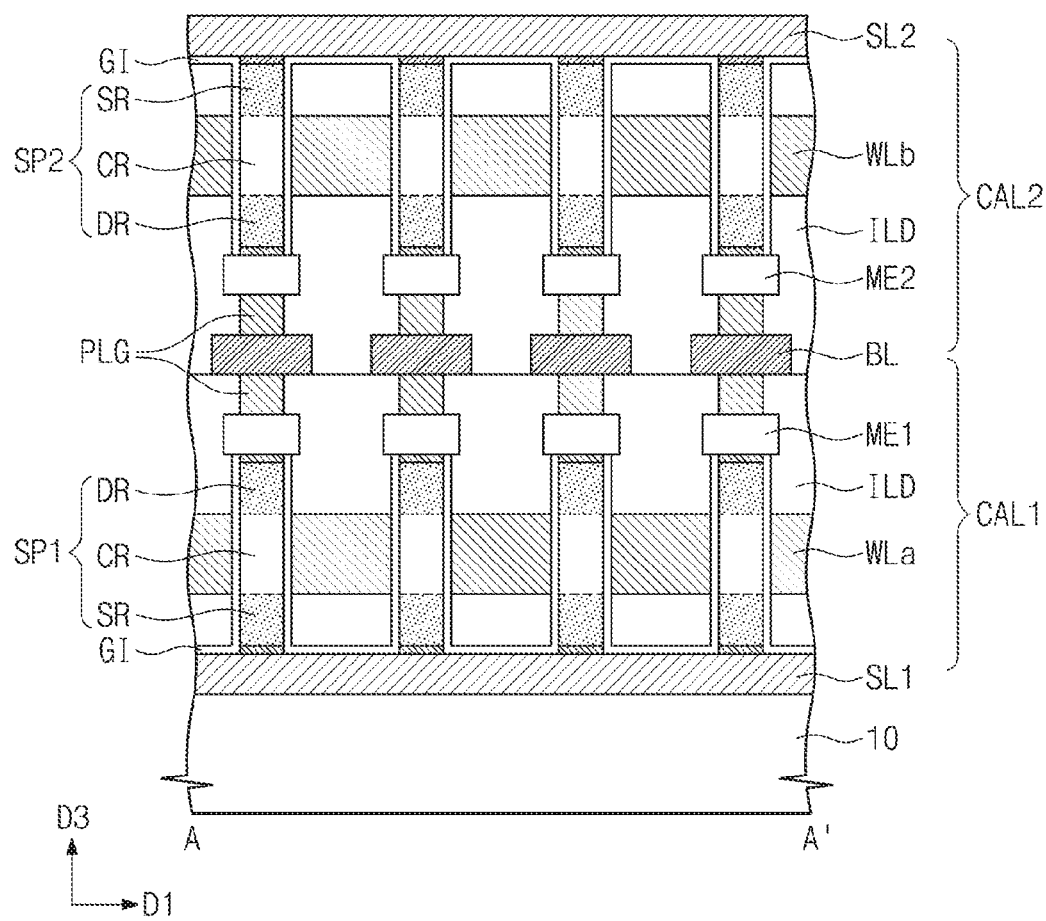
FIGS. 14A and 14B are cross-sectional views taken along lines A-A' and B-B' of FIG. 13, respectively, to illustrate a three-dimensional semiconductor memory device according to exemplary embodiments of the disclosure.
Figure 14B:
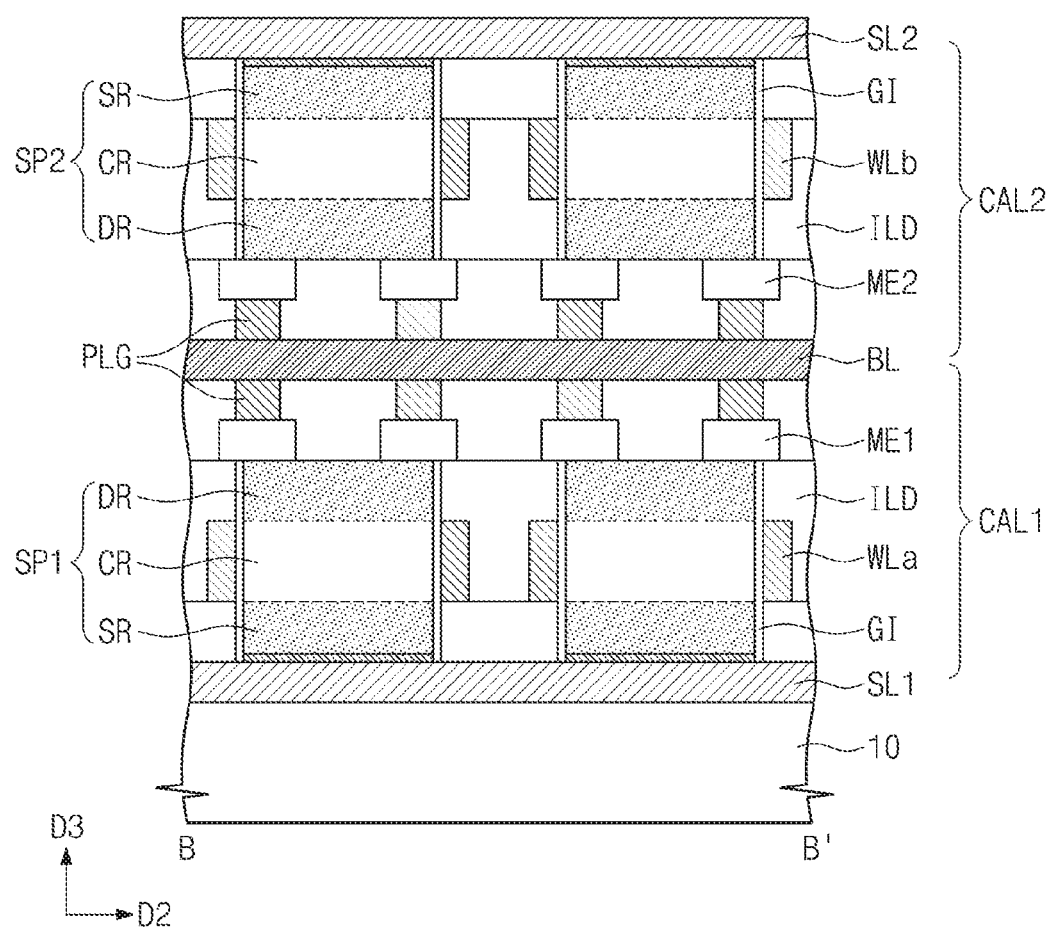
Figure 15:
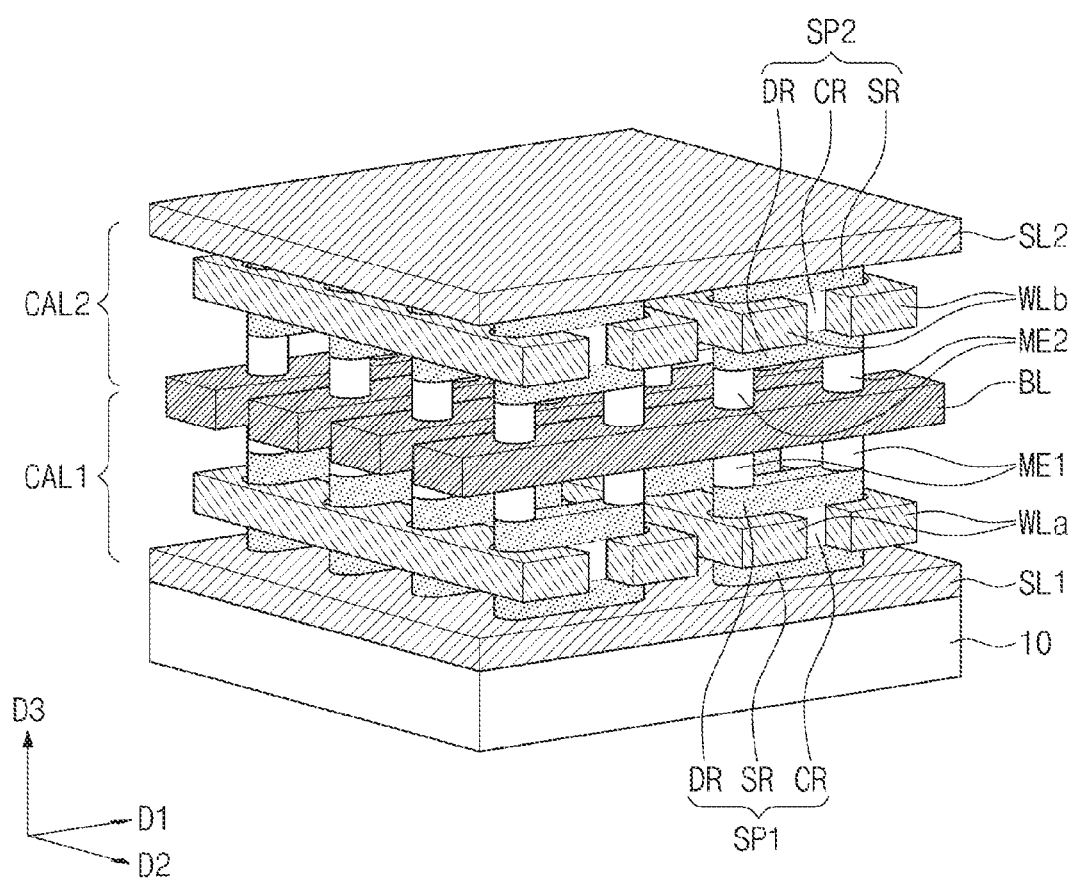
FIG. 15 is a perspective view illustrating a three-dimensional semiconductor memory device according to exemplary embodiments of the disclosure.

FIG. 13 is a plan view illustrating a three-dimensional semiconductor memory device according to exemplary embodiments of the disclosure. FIGS. 14A and 14B are cross-sectional views taken along lines A-A' and B-B' of FIG. 13, respectively, of a three-dimensional semiconductor memory device according to exemplary embodiments of the disclosure. FIG. 15 is a perspective view illustrating a three-dimensional semiconductor memory device according to exemplary embodiments of the disclosure. Configurations substantially the same as those of the three-dimensional semiconductor memory device explained with reference to FIGS. 7, 8A, 8B, 9 and 10 are allocated the same reference numerals thereto, and repetitive descriptions may be omitted herein in the interest of brevity.

Referring to FIGS. 13, 14A, 14B and 15, first and second common source electrodes SL1 and SL2 may be disposed vertically spaced apart from each other on a substrate 10. First and second cell array layers CAL1 and CAL2 may be disposed between the first and second common source electrodes SL1 and SL2, and may share bit lines BL as discussed above.

Lower word lines WLa and upper word lines WLb may be provided to extend in a first direction D1 at different heights, and ones of the lower and upper word lines WLa and WLb may be disposed spaced apart from each other in a second direction D2. In some embodiments, each of the lower and upper word lines WLa and WLb may have a width greater than an interval between either adjacent lower word lines WLa or adjacent upper word lines WLb.

A plurality of first semiconductor pillars SP1 may be disposed spaced apart from each other along the first and second directions D1 and D2 on the first common source electrode SL1, and each of the first semiconductor pillars SP1 may have a width in the second direction D2 greater than that of each of the lower word lines WLa. As discussed above, each of the first semiconductor pillars SP1 may include source and drain regions SR and DR having conductivities opposite to each other and further include a channel region CR between the source and drain regions SR and DR.

The lower word lines WLa may surround portions of the channel regions CR of the first semiconductor pillars SP1. In other words, the first semiconductor pillars SP1 may penetrate portions of the lower word lines WLa.

A pair of the lower word lines WLa may be provided therebetween with the first semiconductor pillars SP1 arranged along the first direction D1. The lower word lines WLa spaced apart from each other may run across opposite sidewalls of each of the first semiconductor pillars SP1. In other words, a pair of the lower word lines WLa may share a single first semiconductor pillar SP1.

A plurality of second semiconductor pillars SP2 may be disposed spaced apart from each other on the bit lines BL, and likewise the first semiconductor pillars SP1 each of the second semiconductor pillars SP2 may have a width in the second direction D2 greater than that of each of the upper word lines WLb. A pair of the upper word lines WLb may be provided therebetween with the second semiconductor pillars SP2 arranged along the first direction D1, and the upper word lines WLb may surround portions of the second semiconductor pillars SP2. That is, a pair of the upper word lines WLb may share a single second semiconductor pillar SP2. Each of the second semiconductor pillars SP2 may include source and drain regions SR and DR having conductivities opposite to each other and further include a channel region CR between the source and drain regions SR and DR.

In some embodiments, a pair of first variable resistance elements ME1 may be disposed on each of the first semiconductor pillars SP1, and a pair of second variable resistance elements ME2 may be disposed on each of the second semiconductor pillars SP2. As shown in FIG. 15, the first and second variable resistance elements ME1 and ME2 may be electrically connected to the bit lines BL. Alternatively, the first variable resistance elements ME1 and the drain regions DR of the second semiconductor pillars SP2 may be electrically connected to the bit lines BL.

Figure 16:
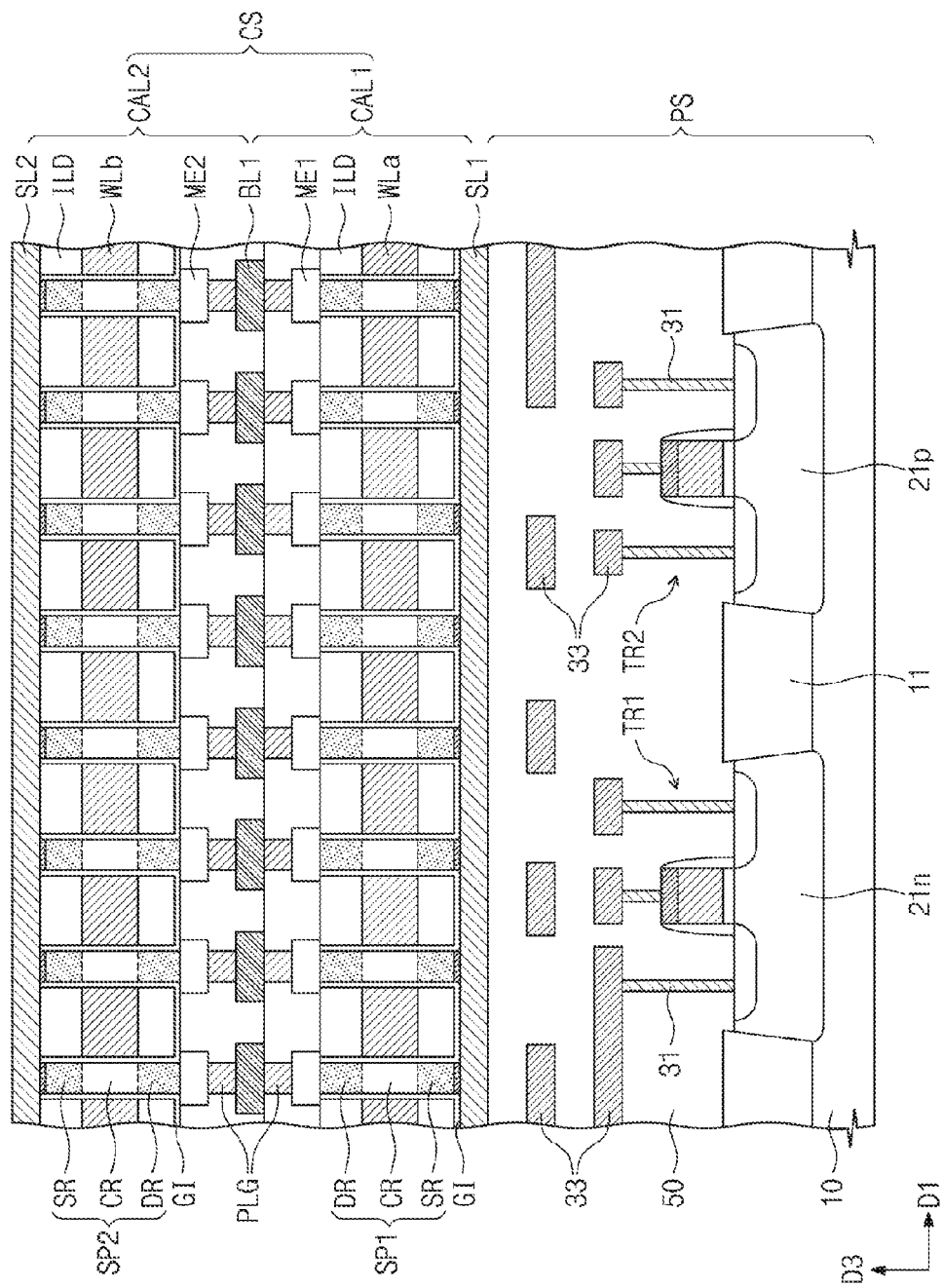
FIG. 16 is a cross-sectional view illustrating a three-dimensional semiconductor memory device according to exemplary embodiments of the disclosure.

FIG. 16 is a cross-sectional view illustrating a three-dimensional semiconductor memory device according to exemplary embodiments of the disclosure. Configurations substantially the same as those of the three-dimensional semiconductor memory device discussed above are allocated the same reference numerals thereto, and repetitive descriptions may be omitted in the interest of brevity.

Referring to FIG. 16, a three-dimensional semiconductor memory device may include a peripheral logic structure PS and a cell array structure CS stacked on the peripheral logic structure PS.

In some embodiments, the peripheral logic structure PS may include peripheral logic circuits such as row and column decoders (refer to the numerals 2 and 3 of FIG. 1), read/write circuits (refer to the numeral 4 of FIG. 1), and control logics (refer to the numeral 5 of FIG. 1), and the peripheral logic circuits may be integrated on a top surface of a substrate 10. The peripheral logic structure PS may further include interconnect line structures electrically connected to the peripheral logic circuits and a lower filling insulation layer 50 covering the peripheral logic circuits and the interconnect line structures. The lower filling insulation layer 50 may include a plurality of stacked insulation layers.

The peripheral logic circuits may include first and second MOS transistors TR1 and TR2 integrated on the substrate 10. For example, the first MOS transistor TR1 may be formed on a first well region 21n that is formed by doping n-type impurities into the substrate 10. The second MOS transistor TR2 may be formed on a second well region 21p that is formed by doping p-type impurities into the substrate 10.

The first and second well regions 21n and 21p may include therein active regions defined by a device isolation layer 11. The first and second MOS transistors TR1 and TR2 may be electrically connected to the cell array structure CS through contact plugs 31 and lower interconnect lines 33.

In some embodiments, the cell array structure CS may include a plurality of cell array layers CAL1 and CAL2 that are vertically stacked on the peripheral logic structure PS.

In detail, first and second common source electrodes SL1 and SL2 may be vertically stacked on the lower filling insulation layer 50 of the peripheral logic structure PS. Thus, a top surface of the lower filling insulation layer 50 may be in contact with the first common source electrode SL1 disposed at a lowermost level of the cell array structure CS.

First and second cell array layers CAL1 and CAL2 may be disposed between the first and second common source electrodes SL1 and SL2, and may share bit lines BL as discussed above. The first and second cell array layers CAL1 and CAL2 may have substantially the same technical features as the three-dimensional semiconductor memory device discussed above.

It will be hereinafter described an operation of a three-dimensional semiconductor memory device according to exemplary embodiments of the disclosure with reference to FIGS. 17 and 18.

Figures 17, 18:
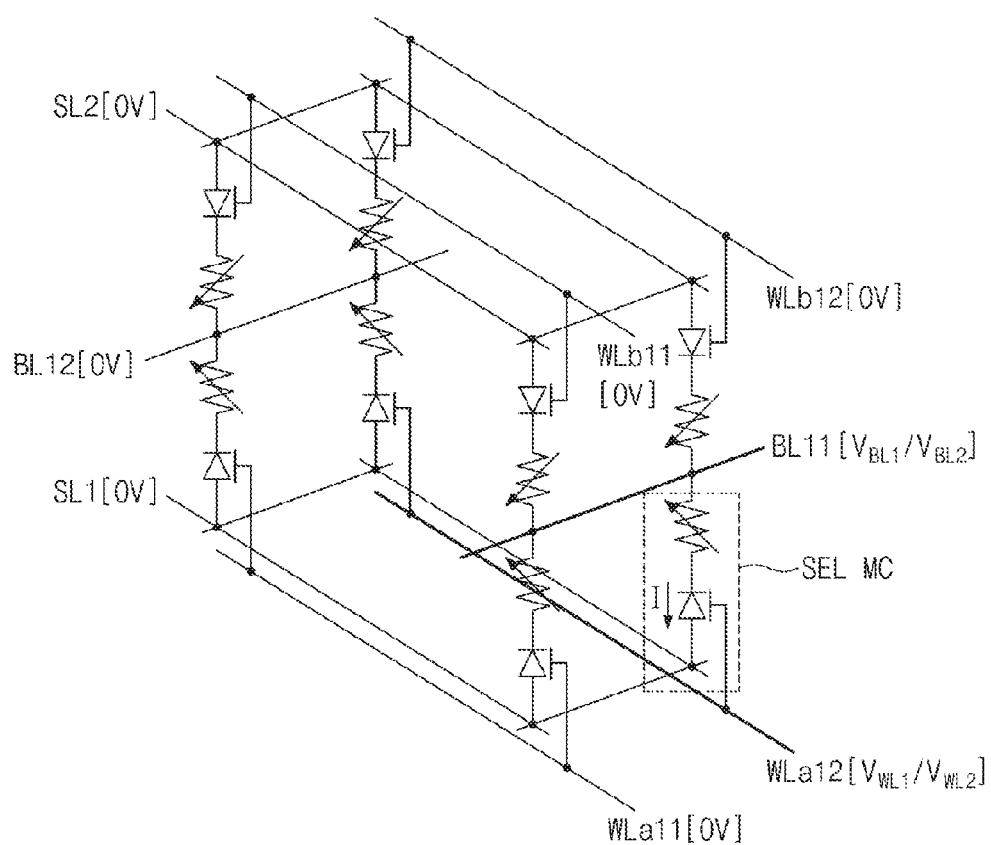
FIG. 17 is a table showing driving voltages of a three-dimensional semiconductor memory device according to exemplary embodiments of the disclosure.
FIG. 18 is a circuit diagram for explaining an operation of a three-dimensional semiconductor memory device according to exemplary embodiments of the disclosure.

FIG. 17 is a table showing driving voltages of a three-dimensional semiconductor memory device according to exemplary embodiments of the disclosure. FIG. 18 is a circuit diagram for explaining an operation of a three-dimensional semiconductor memory device according to exemplary embodiments of the disclosure.

Referring to FIGS. 17 and 18, when operating a three-dimensional semiconductor memory device according to exemplary embodiments, one memory cell SEL MC may be selected by selecting one of a plurality of lower and upper word lines WLa11, WLa12, WLb11 and WLb12 and one of a plurality of bit lines BL11 and BL12.

As discussed with reference to FIG. 4, an operation current provided to a variable resistance element of the selected memory cell SEL MC may be varied depending on a voltage applied to a gate electrode under a condition that a reverse bias is applied to source and drain electrodes of tunnel field effect transistors. In other words, when the three-dimensional semiconductor memory device is operated, tunnel field effect transistors of unselected memory cells may operate as diodes to each of which a reverse bias is applied such that no operation current may flow through the unselected memory cells, and a tunnel field effect transistor of the selected memory cell SEL MC may be turned on caused by a band-to-band tunneling such that an operation current may flow through the selected memory cell SEL MC.

For example, in order to write data to the selected memory cell SEL MC, a first word line voltage VWL1 may be applied to a selected one WLa12 from the plurality of lower and upper word lines, and a turn-off voltage (e.g., 0V) below a threshold voltage may be applied to unselected remaining lower and upper word lines WLa11, WLb11 and WLb12. A first bit line voltage VBL1 may be applied to a selected one BL11 from the plurality of bit lines, and a turn-off voltage (e.g., 0V) may be applied to unselected remaining bit lines BL12. A ground voltage may be commonly applied to source lines SL1 and SL2.

Under the voltage condition described above, a band-to-band tunneling may occur in the tunnel field effect transistor of the selected memory cell SEL MC such that a write current may flow between the selected bit line BL11 and the source line SL1, thereby allowing the write current to change a resistance state of a variable resistance element. For example, the variable resistance element may have a resistance value that varies based on an amount of current or a voltage level flowing through the tunnel field effect transistor of the selected memory cell SEL MC, so that data "1" or "0" may be stored in the selected memory cell SEL MC.

In a first unselected memory cell connected between the selected word line WLa12 and the unselected bit line BL12, no voltage difference may be provided between source and drain electrodes such that no write current may flow between the selected word line WLa12 and the unselected bit line BL12. In a second unselected memory cell connected between the selected bit line BL11 and the unselected word lines WLa11, WLb11 and WLb12, a tunnel field effect transistor may operate as a diode to which a reverse bias is applied such that no write current may flow between the selected bit line BL11 and the unselected word lines WLa11, WLb11 and WLb12.

In order to read data stored in the selected memory cell SEL MC, a second word line voltage VWL2 may be applied to a selected one WLa12 from the plurality of lower and upper word lines, and a turn-off voltage (e.g., 0V) below a threshold voltage may be applied to unselected remaining lower and upper word lines WLa11, WLb11 and WLb12. A second bit line voltage VBL2 may be applied to a selected one BL11 from the plurality of bit lines, and a turn-off voltage (e.g., 0V) may be applied to unselected remaining bit lines BL12. A ground voltage may be commonly applied to source lines SL1 and SL2.

Under the voltage condition described above, a band-to-band tunneling may occur in the tunnel field effect transistor of the selected memory cell SEL MC such that a read current may flow between the selected bit line BL11 and the source line SL1. The read current may be less than a write current capable of switching a resistance state of the variable resistance element in the selected memory cell SEL MC. No band-to-band tunneling may occur in the tunnel field effect transistors of the unselected memory cells such that no read current may flow through the unselected memory cells.

Further, according to exemplary embodiments of the disclosure, a test operation may be performed to test electrical characteristics of all memory cells in each memory block.

When a test operation is performed on a selected memory block, a turn-off voltage (e.g., 0V) may be applied to all of the lower and upper word lines WLa11, WLa12, WLb11 and WLb12, and a forward bias may be applied between source and drain electrodes of tunnel field effect transistors in all of the memory cells. For example, a ground voltage may be commonly applied to all of the source lines SL1 and SL2, and a negative voltage Vnegative may be applied to all of the bit lines BL11 and BL12. In other words, the tunnel field effect transistors of all of the memory cells may operate as diodes to each of which a forward bias is applied. Thus, a forward flow of current may occur between the source lines SL1 and SL2 and the bit lines BL11 and BL12 in the tunnel field effect transistors of all of the memory cells.

Under the aforementioned condition, it may be possible to detect defective and normal cells by measuring and analyzing leakage current occurred in the memory cells of each memory block.

According to exemplary embodiments of the disclosure, a tunnel field effect transistor may be used as a switching element of a memory cell in a three-dimensional semiconductor memory device including memory cells arranged in a cross-point structure. The tunnel field effect transistor may control a flow of electrons or holes using a band-to-band tunneling, so it is possible to achieve higher output current for a small gate voltage (or driving voltage). It therefore may be possible to enhance current properties of memory cells under a low voltage condition when operating the three-dimensional semiconductor memory device. In addition, as the tunnel field effect transistor is used as the switching element, electrical characteristics of the switching element may be less affected by a crystal structure of semiconductor material constituting the tunnel field effect transistor. It may then be possible to accomplish tunnel field effect transistors using an amorphous semiconductor material that is formed at a low temperature process.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been described in connection with the exemplary embodiments illustrated in the accompanying drawings, it will be understood by one of ordinary skill in the art that variations in form and detail may be made therein without departing from the spirit and essential features of the disclosure. The above-disclosed embodiments should thus be considered illustrative and not restrictive.

What is claimed is:

1. A three-dimensional semiconductor memory device comprising:
    first, second, and third cell array layers vertically and sequentially stacked on a substrate, wherein each of the first to third cell array layers comprises a plurality of memory cells arranged along a first direction and a second direction crossing the first direction, wherein each of the plurality of memory cells includes a variable resistance element and a tunnel field effect transistor that are connected in series;
    a plurality of bit lines extending along the first direction and disposed between the first and second cell array layers, wherein the plurality of memory cells of the first and second cell array layers share the bit lines; and
    a source line extending along both the first direction and the second direction and disposed between the second and third cell array layers, wherein the plurality of memory cells of the second and third cell array layers share the source line,
    wherein the first and second directions are parallel to a top surface of the substrate,
    the tunnel field effect transistor comprises a semiconductor pillar that is perpendicular to the top surface of the substrate in a cross-sectional view and source and drain regions provided in the semiconductor pillar, and
    the source and drain regions have conductivities opposite to each other.

2. The three-dimensional semiconductor memory device of claim 1, wherein each of the tunnel field effect transistors included in the plurality of memory cells comprises a semiconductor pillar that is perpendicular to the top surface of the substrate and source and drain regions that have conductivities opposite to each other in the semiconductor pillar.

3. The three-dimensional semiconductor memory device of claim 1, wherein
    each of the first to third cell array layers comprises a plurality of word lines extending along the second direction, and
    each of the word lines controls tunnel field effect transistors of the plurality of memory cells arranged along the second direction.

4. The three-dimensional semiconductor memory device of claim 1, wherein each of the bit lines is connected to variable resistance elements of the plurality of memory cells arranged along the first direction on the first and second cell array layers.

5. The three-dimensional semiconductor memory device of claim 1, wherein each of the bit lines is connected to variable resistance elements of the plurality of memory cells arranged along the first direction on the first cell array layer and tunnel field effect transistors of the plurality of memory cells arranged along the first direction on the second cell array layer.

6. A three-dimensional semiconductor memory device comprising:
    a plurality of first memory cells arranged along a first direction and a second direction crossing the first direction at a first height from a substrate;
    a plurality of lower word lines extending along the first direction and controlling the plurality of first memory cells;
    a plurality of second memory cells arranged along the first direction and the second direction at a second height greater than the first height from the substrate;
    a plurality of upper word lines extending along the first direction and controlling the plurality of second memory cells; and
    a plurality of bit lines extending along the second direction at a third height greater than the first height and less than the second height from the substrate, each of the bit lines being commonly connected to the plurality of first and second memory cells that are vertically adjacent to each other and arranged along the second direction, wherein:
    the plurality of first memory cells comprise first semiconductor pillars vertically penetrating the lower word lines in a plan view, and the plurality of second memory cells comprise second semiconductor pillars vertically penetrating the plurality of upper word lines in a plan view, each of the first and second semiconductor pillars comprising source regions and drain regions having conductivities opposite to each other, and the first and second directions are parallel to a top surface of the substrate.

7. The three-dimensional semiconductor memory device of claim 6, further comprising:
a first common source electrode commonly connected to the source regions of the first semiconductor pillars; and
a second common source electrode commonly connected to the source regions of the second semiconductor pillars.

8. A three-dimensional semiconductor memory device comprising:
first and second source lines;
a first bit line;
a plurality of first memory cells disposed between the first source line and the first bit line; and
a plurality of second memory cells disposed between the second source line and the first bit line, wherein:
each of the plurality of first and second memory cells comprises a variable-resistance element and a tunnel field-effect transistor,
the variable-resistance element of each of the plurality of first memory cells is disposed between the first bit line and the tunnel field-effect transistor of each of the plurality of first memory cells,
the variable-resistance element of each of the plurality of second memory cells is disposed between the first bit line and the tunnel field-effect transistor of each the plurality of second memory cells,
each of the plurality of first memory cells includes a first semiconductor pillar and a first word line surrounding the first semiconductor pillar in a cross-sectional view, and
each of the plurality of second memory cells includes a second semiconductor pillar and a second word line surrounding the second semiconductor pillar in a cross-sectional view.

9. The three-dimensional semiconductor memory device of claim 8, further comprising:
a substrate, wherein:
the plurality of first memory cells are disposed within a first layer,
the plurality of second memory cells are disposed in a second layer, and
the first layer is disposed between the second layer and the substrate.

10. The three-dimensional semiconductor memory device of claim 8, wherein a conductivity of the tunnel field-effect transistor of each of the plurality of first and second memory cells is controlled by a different word line.

11. The three-dimensional semiconductor memory device of claim 8, further comprising:
a third source line;
a second bit line;
a plurality of third memory cells disposed between the second source line and the second bit line; and
a plurality of fourth memory cells disposed between the third source line and the second bit line.

12. The three-dimensional semiconductor memory device of claim 11, further comprising:
a substrate, wherein:
the plurality of first memory cells are disposed within a first layer,
the plurality of second memory cells are disposed in a second layer,
the first layer is disposed between the second layer and the substrate,
the plurality of third memory cells are disposed within a third layer,
the plurality of fourth memory cells are disposed in a fourth layer, and
the third layer is disposed between the fourth layer and the second layer.

13. The three-dimensional semiconductor memory device of claim 11, wherein each of the plurality of third and fourth memory cells comprises a variable-resistance element and a tunnel field-effect transistor.

14. The three-dimensional semiconductor memory device of claim 13, wherein a conductivity of the tunnel field-effect transistor of each of the plurality of first, second, third, and fourth memory cells is controlled by a different word line.

15. The three-dimensional semiconductor memory device of claim 13, wherein the variable-resistance element of each of the plurality of third memory cells is disposed between the second bit line and the tunnel field-effect transistor of the third memory cell.

\* \* \* \* \*